United States Patent
Higuchi et al.

(10) Patent No.: US 8,759,901 B2
(45) Date of Patent: Jun. 24, 2014

(54) NONVOLATILE SEMICONDUCTOR MEMORY DEVICE INCLUDING A CHARGE STORAGE LAYER AND SEMICONDUCTOR REGION IN A GROOVE

(75) Inventors: Masaaki Higuchi, Yokkaichi (JP);
Yoshio Ozawa, Yokohama (JP);
Katsuyuki Sekine, Yokkaichi (JP);
Ryota Fujitsuka, Mie-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 627 days.

(21) Appl. No.: 12/855,212

(22) Filed: Aug. 12, 2010

(65) Prior Publication Data

US 2011/0049612 A1 Mar. 3, 2011

(30) Foreign Application Priority Data

Aug. 25, 2009 (JP) ................................. 2009-194542

(51) Int. Cl.
*H01L 29/792* (2006.01)
(52) U.S. Cl.
USPC .......................................... 257/324; 257/326
(58) Field of Classification Search
USPC ................................................. 257/326, 324
See application file for complete search history.

(56) References Cited

U.S. PATENT DOCUMENTS

| | | | |
|---|---|---|---|
| 2007/0252201 A1 | 11/2007 | Kito et al. | |
| 2009/0008704 A1 | 1/2009 | Okamura | |
| 2009/0173989 A1 * | 7/2009 | Yaegashi | 257/320 |
| 2009/0212350 A1 * | 8/2009 | Kidoh et al. | 257/324 |

FOREIGN PATENT DOCUMENTS

| | | |
|---|---|---|
| JP | 2009-16615 | 1/2009 |
| JP | 2009-54886 | 3/2009 |
| JP | 2009-81316 | 4/2009 |
| JP | 2009-94237 | 4/2009 |
| JP | 2009-146942 | 7/2009 |
| JP | 2009-152498 | 7/2009 |
| JP | 2009-164433 | 7/2009 |
| KR | 10-2007-0102408 | 10/2007 |
| KR | 10-2007-0120887 | 12/2007 |

OTHER PUBLICATIONS

Office Action issued Aug. 4, 2011, in Korean Patent Application No. 10-2010-81947 with English translation.
U.S. Appl. No. 12/679,991, filed Mar. 25, 2010, Yoshiaki Fukuzumi et al.
Japanese Office Action mailed Jul. 16, 2013, in Japanese Patent Application No. 2009-194542 filed Aug. 25, 2009 (with English Translation).
Office Action mailed Jan. 7, 2014, in Japanese Patent Application No. 2009-194542, filed Aug. 25, 2009 (with English-language Translation), 6 pages.

* cited by examiner

*Primary Examiner* — Howard Weiss
*Assistant Examiner* — Tifney Skyles
(74) *Attorney, Agent, or Firm* — Oblon, Spivak, McClelland, Maier & Neustadt, L.L.P.

(57) ABSTRACT

According to one embodiment, a nonvolatile semiconductor memory device including a semiconductor layer with a main surface, a first insulating layer formed on the main surface of the semiconductor layer, a charge storage layer formed on the first insulating layer, a second insulating layer formed on the charge storage layer, and a control gate electrode formed on the second insulating layer. At least one inelastic scattering film that reduces energy of electrons by scattering is contained in at least one of the charge storage layer and second insulating layer.

7 Claims, 22 Drawing Sheets

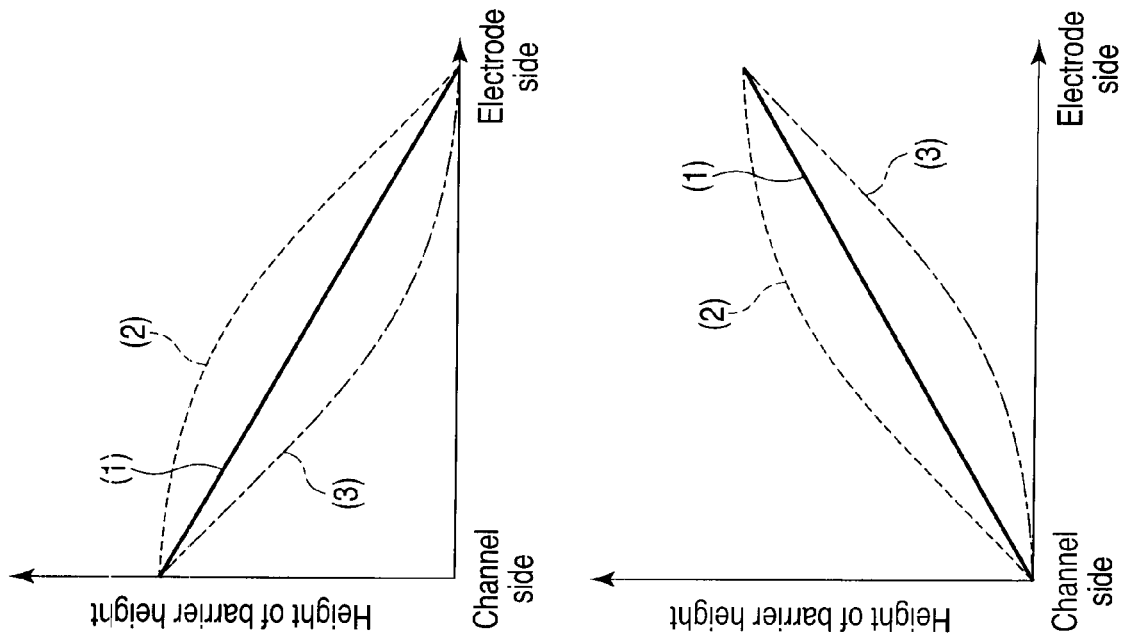
FIG. 4B
FIG. 4C
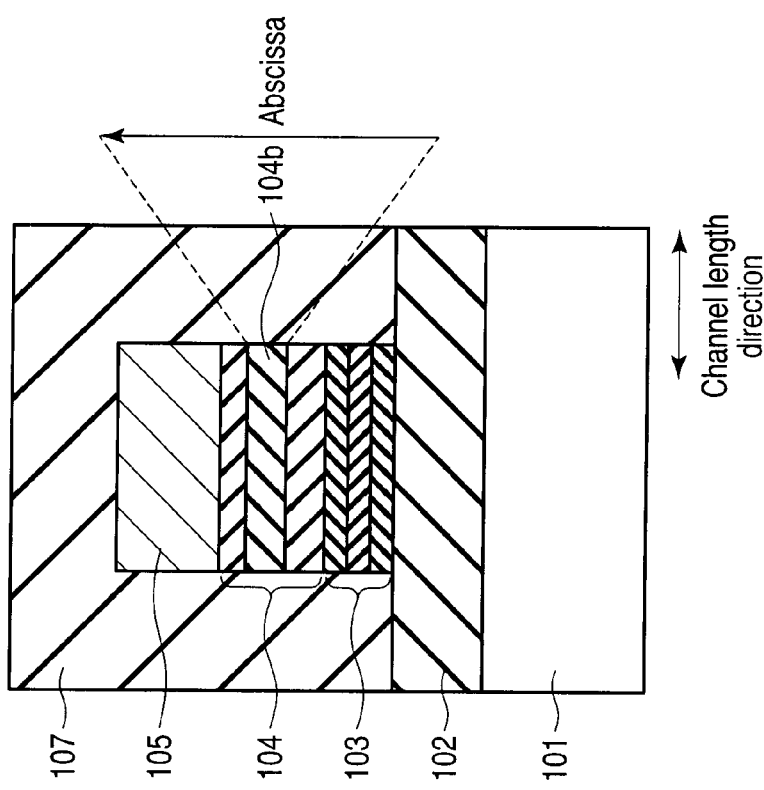
FIG. 4A

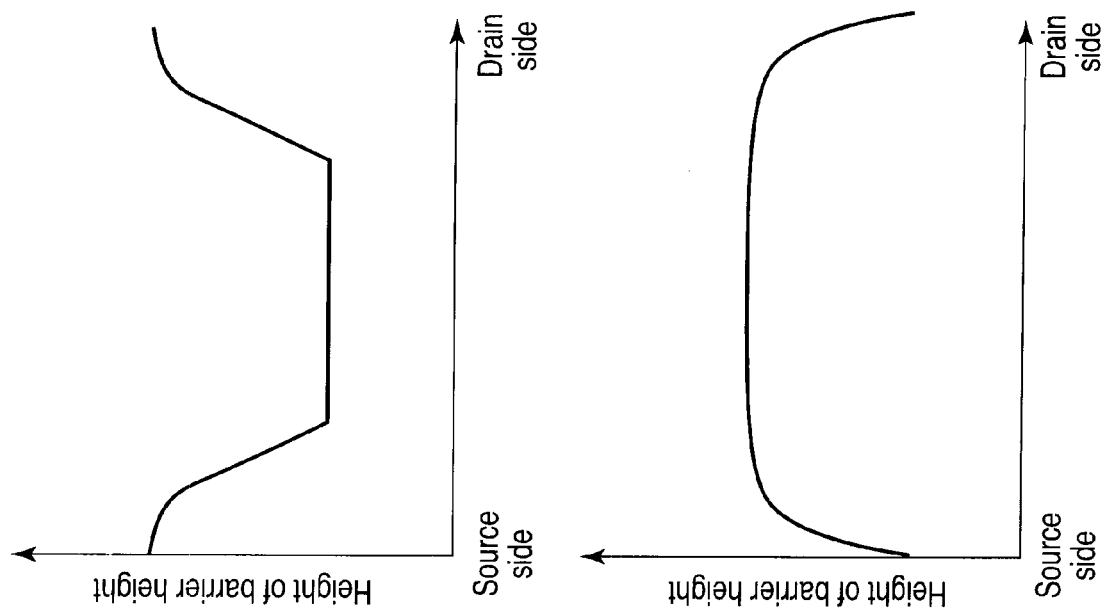
FIG. 5B
FIG. 5C
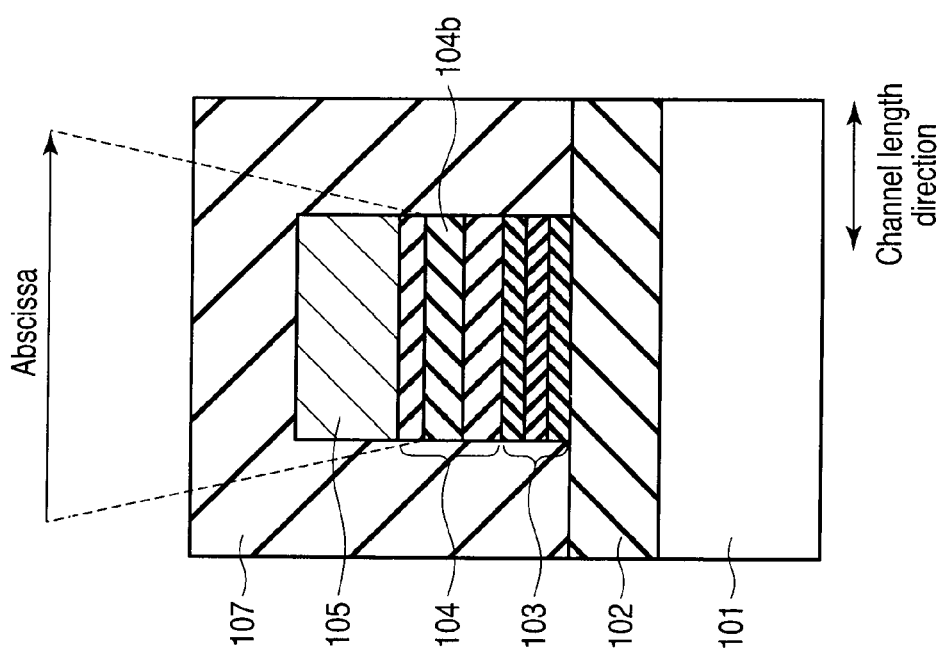
FIG. 5A

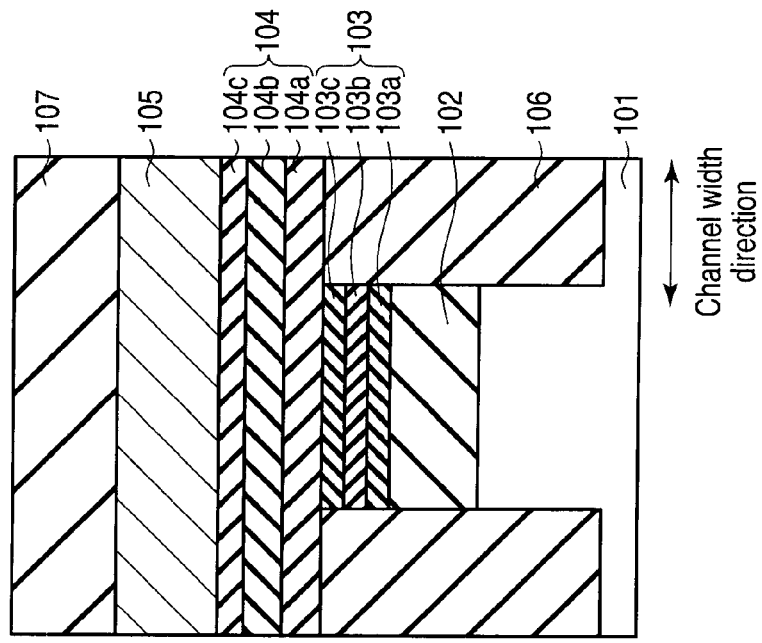
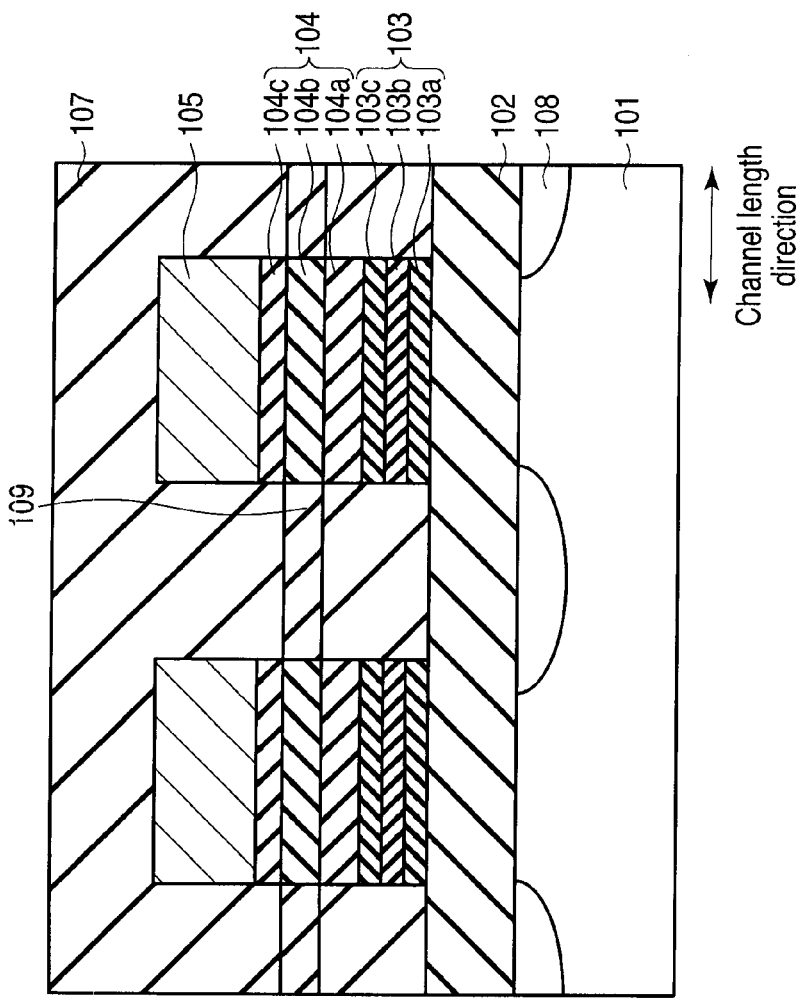

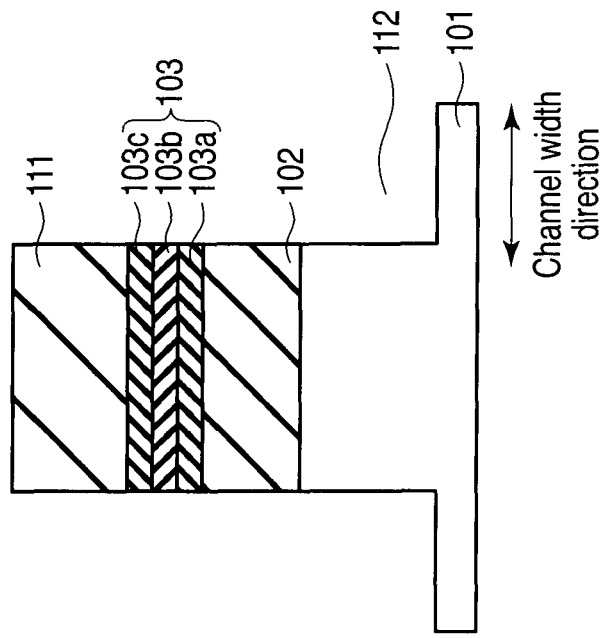
F I G. 8B
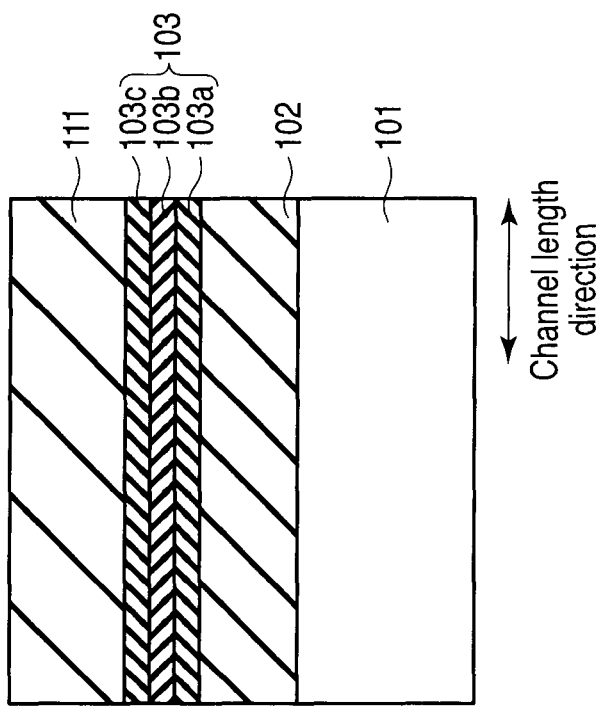
F I G. 8A

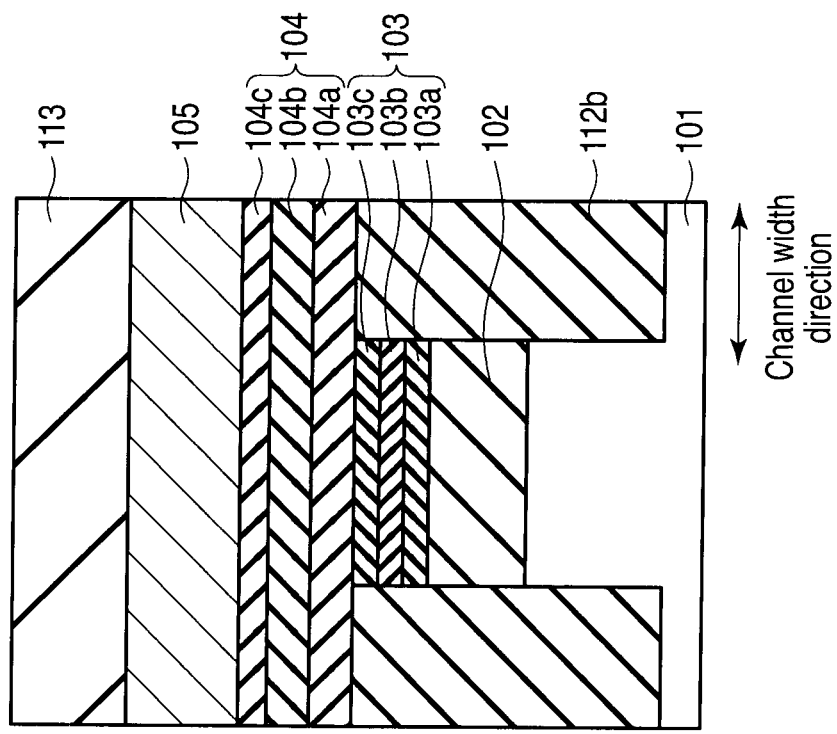
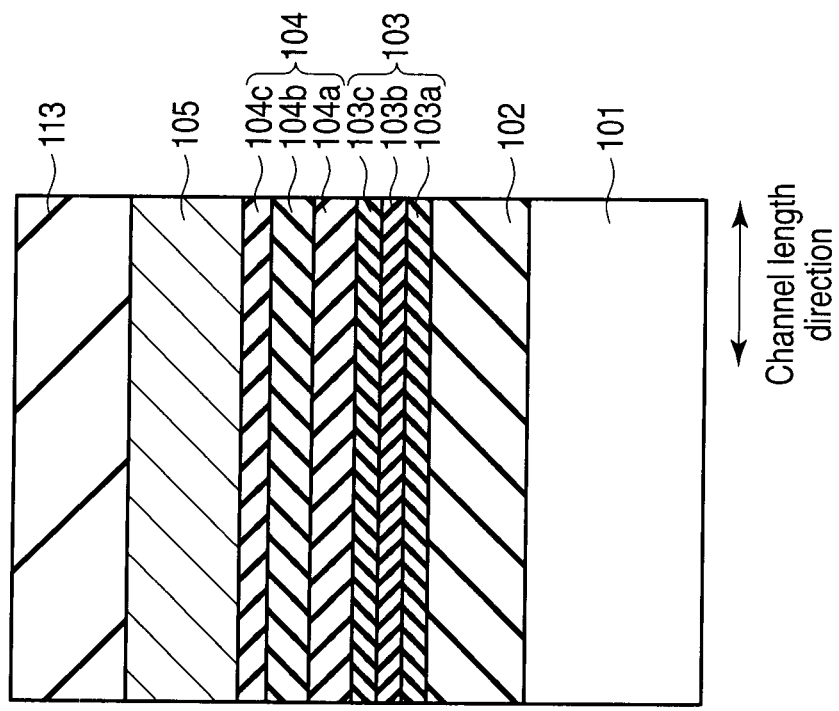

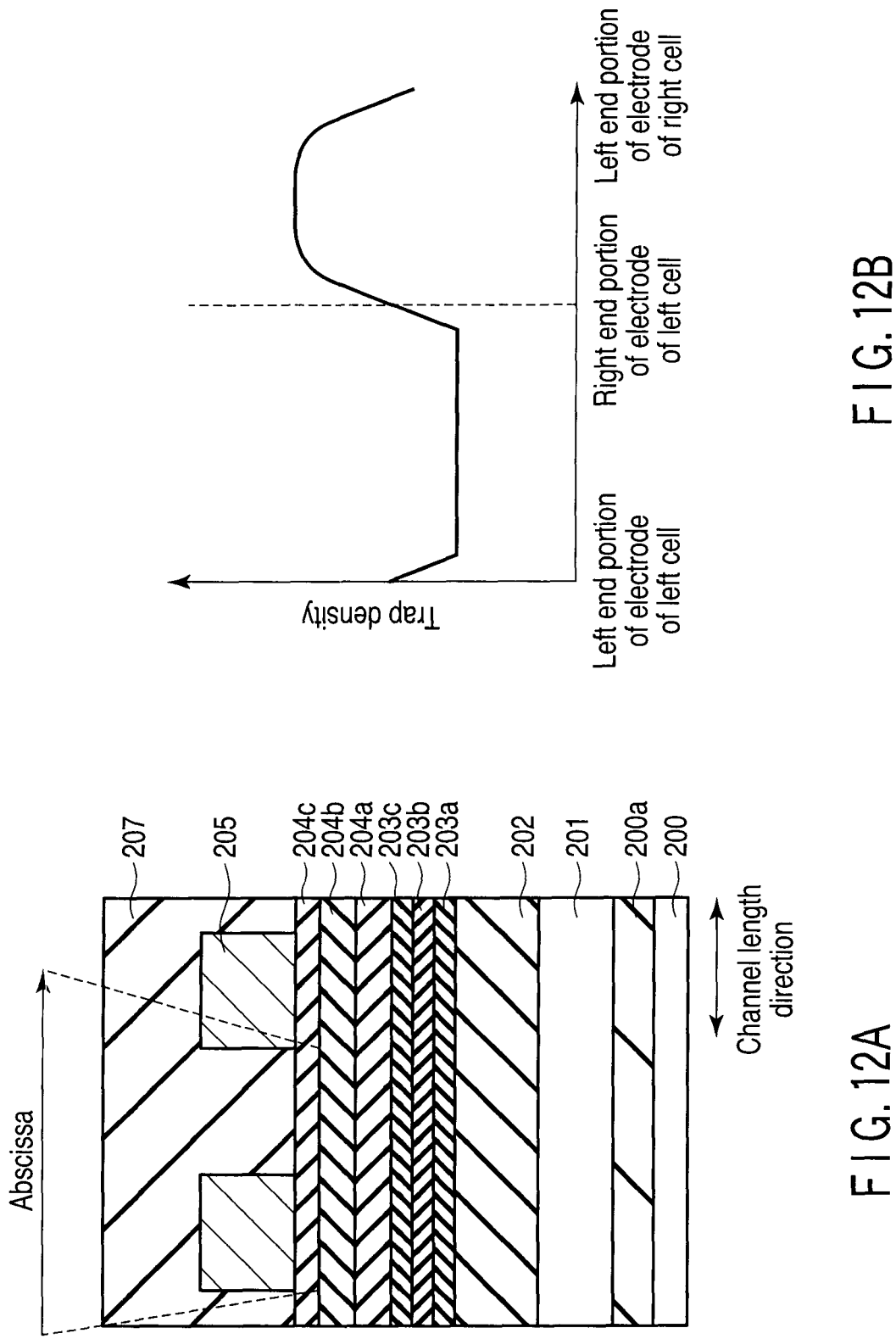

US 8,759,901 B2

NONVOLATILE SEMICONDUCTOR MEMORY DEVICE INCLUDING A CHARGE STORAGE LAYER AND SEMICONDUCTOR REGION IN A GROOVE

CROSS-REFERENCE TO RELATED APPLICATIONS

This application is based upon and claims the benefit of priority from Japanese Patent Application No. 2009-194542, filed Aug. 25, 2009; the entire contents of which are incorporated herein by reference.

FIELD

Embodiments described herein relate generally to a nonvolatile semiconductor memory device and a manufacturing method thereof.

BACKGROUND

As one example of the structure of a memory cell in a nonvolatile semiconductor memory device, a metal/oxide film/nitride film/oxide film/semiconductor (MONOS) structure in which interference between adjacent memory cells is suppressed is provided (for example, see Jp-A 2009-16615 (KOKAI)).

The MONOS memory cell is a defined as a memory cell in which a charge storage layer is formed of an insulating body having a charge trap function. Therefore, a structure in which the charge storage layer is formed above the upper surface of a semiconductor layer with a tunnel insulating film disposed therebetween and a control gate electrode is formed above the upper surface of the charge storage layer with a charge block layer disposed therebetween is provided.

At the erase operation time of the MONOS memory cell, the semiconductor layer is grounded and a negative voltage is applied to the control gate electrode. By setting the above voltage relation, holes are injected from the semiconductor layer into the charge storage layer. Therefore, electrons stored in the charge storage layer will disappear.

In the memory cell, insulation of the charge block layer is not complete. Therefore, electrons will leak from the control gate electrode towards the semiconductor layer at the erase operation time. Electrons having leaked from the control gate electrode are accelerated until they reach the interface of the tunnel insulating film/semiconductor layer and gain a great amount of energy. Thus, the electrons are impact-ionized in the semiconductor layer. Therefore, damage is done to the tunnel insulating film and the interface of the tunnel insulating film/semiconductor layer and insulation of the tunnel insulating film is degraded. As a result, there occurs a problem that the charge holding characteristic of the memory cell will be degraded.

BRIEF DESCRIPTION OF THE DRAWINGS

FIGS. 4A, 4B and 4C are a cross-sectional view and diagrams for illustrating the structure of a MONOS memory cell according to a modification of the first embodiment.

FIGS. 5A, 5B and 5C are a cross-sectional view and diagrams for illustrating the structure of a MONOS memory cell according to a modification of the first embodiment.

FIGS. 6A and 6B are cross-sectional views showing the structure of a MONOS memory cell according to a modification of the first embodiment.

FIGS. 8A and 8B are cross-sectional views showing a manufacturing step of the MONOS memory cell according to the first embodiment.

FIGS. 9A and 9B are cross-sectional views showing a manufacturing step of the MONOS memory cell according to the first embodiment.

FIGS. 12A and 12B are a cross-sectional view and diagram respectively showing the structure of and trap density in a depletion MONOS memory cell according to a modification of the second embodiment.

DETAILED DESCRIPTION

In general, according to one embodiment, a nonvolatile semiconductor memory device including a semiconductor layer with a main surface, a first insulating layer formed on the main surface of the semiconductor layer, a charge storage layer formed on the first insulating layer, a second insulating layer formed on the charge storage layer, and a control gate electrode formed on the second insulating layer, wherein at least one inelastic scattering film that reduces energy of electrons by scattering is contained in at least one of the charge storage layer and second insulating layer.

Embodiments will be explained in detail with reference to the accompanying drawings.

(1-1) Structure of First Embodiment

Figure 1A:
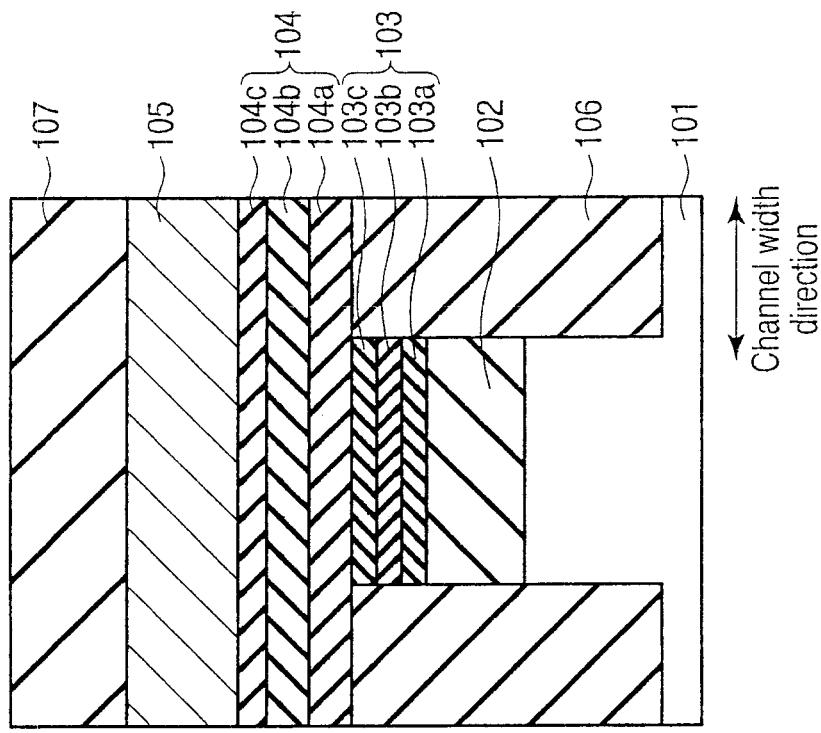
FIGS. 1A and 1B are cross-sectional views showing the structure of a MONOS memory cell according to a first embodiment.
Figure 1B:
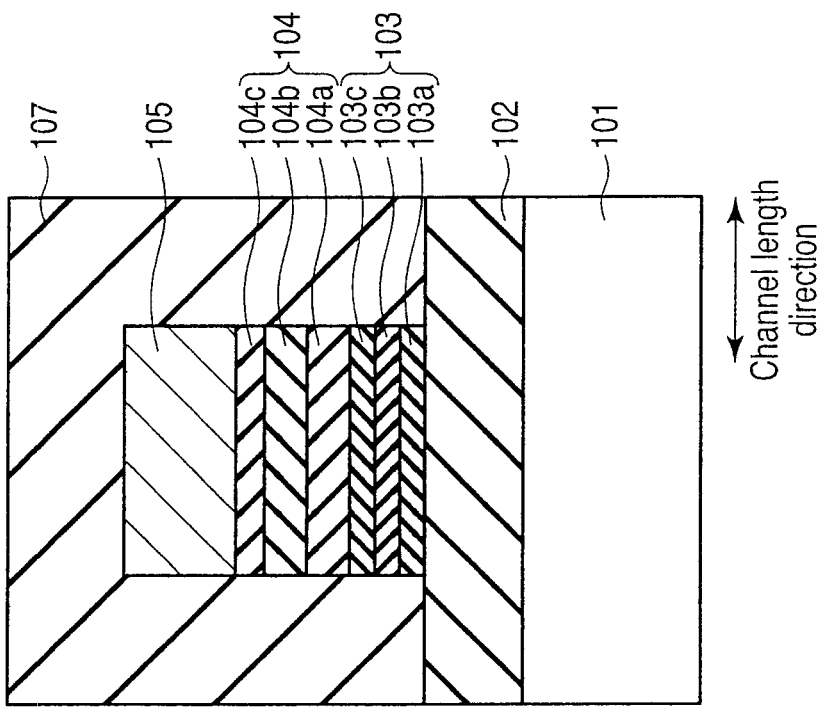

FIGS. 1A and 1B illustrate the structure of a MONOS memory cell according to a first embodiment, FIG. 1A is a cross-sectional view in a channel length direction and FIG. 1B is a cross-sectional view in a channel width direction.

On the main surface of a semiconductor layer 101, a tunnel insulating film 102 (first insulating film), charge storage layer 103, charge block layer 104 (second insulating layer) and control gate electrode 105 are sequentially formed in this order. In this case, the charge storage layer 103 has a lower charge storage film 103a, inelastic scattering film 103b and upper charge storage film 103c sequentially formed from the bottom. The charge block layer 104 has a lower charge block film 104a, inelastic scattering film 104b and upper charge block film 104c sequentially formed from the bottom. Further, regions between the respective memory cells in the channel length direction are covered with a cell-cell insulating film 107.

As shown in FIG. 1B, element isolation insulating films 106 are formed at the sidewalls of the tunnel insulating film 102 and charge storage layer 103.

In this case, it is defined that, for example, the trap density in the inelastic scattering film is greater than or equal to $10^{18}/cm^3$ or the difference in height of the potential barrier [barrier height] between the charge storage layer or charge block layer and the inelastic scattering film is greater than or equal to 0.2 eV. Further, it may be defined that a combination of the above two conditions is set. The "trap" means a dangling bond. That is, it is configured by a dangling bond of Si or a state in which impurities of hydrogen, boron, phosphorus, arsenic, carbon, chlorine, fluorine and metal (for example, Fe, Cr, Ni, W, Cu) are contained.

If the inelastic scattering film is defined according to the trap density in the insulating film, electrons are trapped or de-trapped in the inelastic scattering film. Therefore, energy of electrons can be taken away by temporarily trapping or de-trapping electrons leaking from the control gate electrode 105 in an erase operation.

Further, if the inelastic scattering film is defined according to the difference in barrier height, potential energy of the inelastic scattering film becomes lower than that of the surrounding insulating film. Therefore, energy of electrons leaking from the control gate electrode 105 can be taken away by so-called potential scattering at the erase operation time.

If the inelastic scattering film has charges of $10^{12}/cm^2$ or more, energy of electrons can be taken away by so-called coulomb scattering. The type of charges may be positive or negative.

Figure 2:
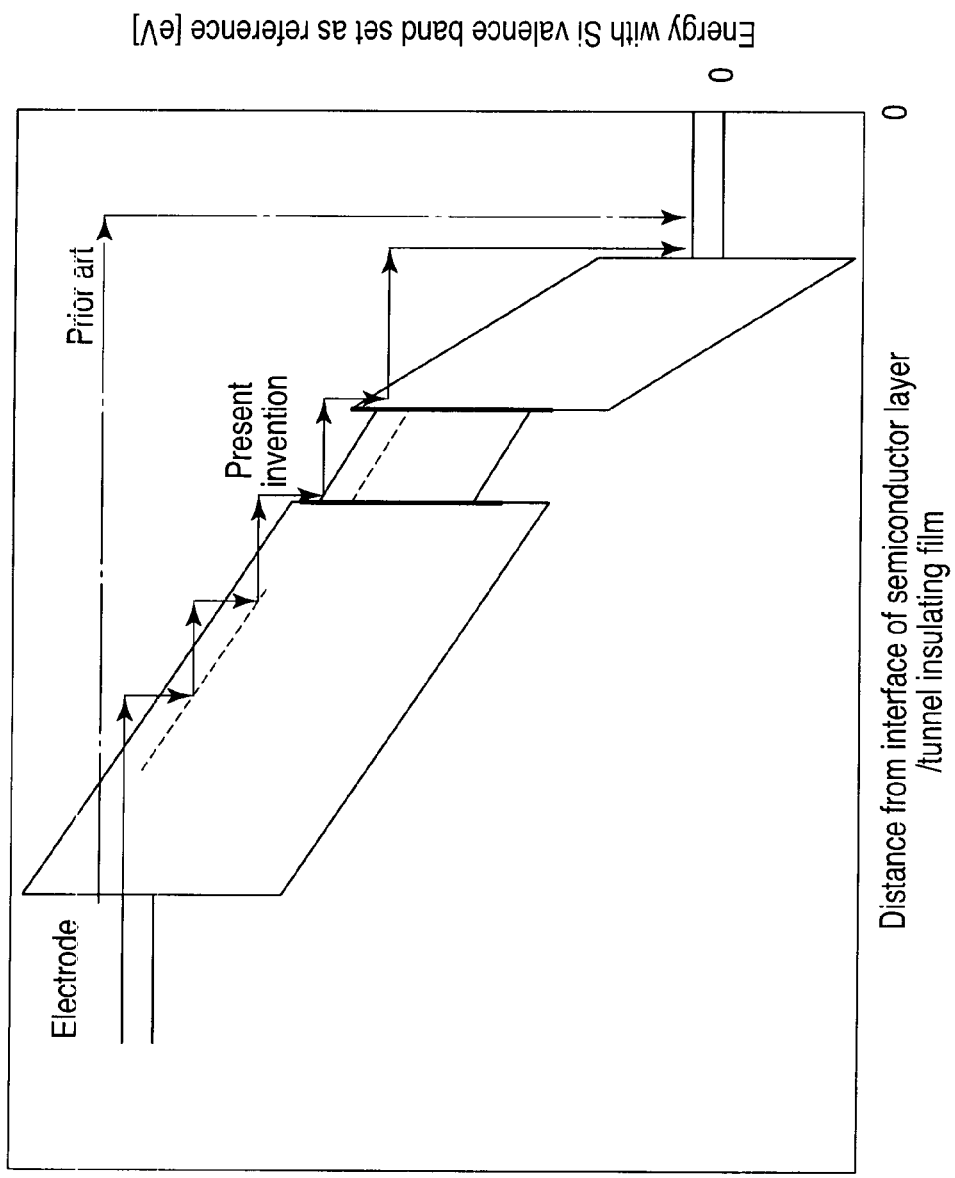
FIG. 2 is a band diagram in the first embodiment.

FIG. 2 is a band diagram in the first embodiment. The abscissa indicates a distance from the interface of the tunnel insulating film/semiconductor layer and the ordinate indicates energy with an Si valence band set as a reference.

If an inelastic scattering film is not formed as in the prior art case, electrons leaking from the control gate electrode 105 will gain a great amount of energy until they reach the interface of the tunnel insulating film/semiconductor layer. Therefore, electrons leaking from the control gate electrode 105 are impact-ionized in the semiconductor layer 101 to generate hot holes. As a result, damage is done to the tunnel insulating film 102 and the interface of the tunnel insulating film/semiconductor layer. Thus, the insulation of the tunnel insulating film 102 is degraded.

On the other hand, in this embodiment, an inelastic scattering film is formed and electrons are trapped or de-trapped in the inelastic scattering film or temporarily held as shown in FIG. 2. Thus, energy of electrons leaking from the control gate electrode 105 can be taken away. That is, since the inelastic scattering film takes away energy of electrons leaking from the control gate electrode 105 in the erase operation, electrons are not impact-ionized in the semiconductor layer 101. Therefore, damage done to the tunnel insulating film 102 and the interface of the tunnel insulating film/semiconductor layer can be reduced and the insulation of the tunnel insulating film 102 can be maintained. As a result, degradation of the charge holding characteristic of the MONOS memory cell can be prevented.

If damage is done to the tunnel insulating film 102 and the interface of the tunnel insulating film/semiconductor layer due to electrons leaking from the control gate electrode 105, dangling bonds will occur in this area. Therefore, electrons will be accumulated on the tunnel insulating film 102 and the interface of the tunnel insulating film/semiconductor layer at the write/erase operation time. The electrons obstruct the write/erase operation.

In this embodiment, since damage done to the tunnel insulating film 102 and the interface of the tunnel insulating film/semiconductor layer is reduced, the write/erase operation speed can be maintained even if the write/erase operation is repeatedly performed.

For example, the inelastic scattering film 103b is a hafnium oxide film containing hafnium and oxygen as main components and the film thickness thereof is set to 1 to 5 nm, for example. The reason why the inelastic scattering film 103b is formed is to reduce a larger amount of energy by trapping electrons in an energy level lower than energy of a trap level in which a silicon nitride film containing silicon and nitrogen as main components is formed.

For example, the inelastic scattering film 104b is a silicon nitride film containing silicon and nitrogen as main components and the film thickness thereof is set to 1 to 5 nm, for example. The ratio of nitrogen to silicon in the silicon nitride film is set almost equal to the stoichiometric composition ratio (N/Si~1.33). Further, the ratio of nitrogen to silicon may be silicon-rich (N/Si<1.33) in comparison with the stoichiometric composition ratio. In this case, since the trap density in the inelastic scattering film 104b increases, electrons tend to be trapped in the inelastic scattering film 104b. Therefore, it becomes possible to attain the feature that energy of electrons leaking from the control gate electrode 105 is reduced in the inelastic scattering film 104b and damage done to the tunnel insulating film 102 and the interface of the tunnel insulating film/semiconductor layer is reduced.

Further, oxygen may be contained in the silicon nitride film. In this case, an amount of charges accumulated in the inelastic scattering film 104b is reduced. As a result, since the possibility that electrons accumulated on the charge storage layer 103 are extracted to the control gate electrode becomes weak, the feature that the charge holding characteristic is enhanced can be attained.

Further, for example, the inelastic scattering film 104b may be a silicon oxide film that contains silicon and oxygen as main components and further contains hydrogen, boron, phosphorus, arsenic, carbon, chlorine, fluorine or metal (for example, Fe, Cr, Ni, W). In this case, plural types of the above components may be contained.

Further, for example, the inelastic scattering film 104b may be a hafnium oxide film containing hafnium and oxygen as main components. This is because more energy can be reduced by trapping electrons in an energy level lower than energy of a trap level in which a silicon nitride film containing silicon and nitrogen as main components is formed.

For example, the semiconductor layer 101 contains silicon as a main component and doped with impurities. The tunnel insulating film 102 is a silicon oxide film containing silicon and oxygen as main components or a silicon oxynitride film containing silicon, oxygen and nitrogen as main components, for example, and the film thickness thereof is set to 2 to 7 nm, for example. Each of the lower charge storage film 103a and upper charge storage film 103c is a silicon nitride film containing silicon and nitrogen as main components, for example, and the film thickness thereof is set to 0 to 9 nm, for example.

Each of the lower charge block film 104a and upper charge block film 104c is an alumina film containing aluminum and oxygen as main components, a silicon oxide film containing silicon and oxygen as main components or a silicon oxynitride film containing silicon, oxygen and nitrogen as main components, for example, and the film thickness thereof is set to 8 to 20 nm, for example. Further, the lower charge block film 104a and upper charge block film 104c may be formed of films with different compositions.

The control gate electrode 105 may be formed of a silicon film doped with impurities, tantalum nitride or silicide of silicon and metal such as tungsten. Each of the element isolation insulating film 106 and cell-cell insulating film 107 is a silicon oxide film containing silicon and oxygen as main components.

The difference in the effect depending on a position of the charge block layer 104 in which the inelastic scattering film is formed is explained. Further, it is supposed that the film thickness of the lower charge block film 104a is set to X nm and the film thickness of the upper charge block film 104c is set to Y nm.

In the case of X>Y, the inelastic scattering film 104b is formed in a region closer to the control gate electrode 105 rather than the charge storage layer 103. In this case, since electrons trapped in the inelastic scattering film 104b at the erase operation time tend to be de-trapped at the write operation time, the charge holding characteristic is enhanced.

In the case of X<Y, the inelastic scattering film 104b is formed in a region closer to the charge storage layer 103 rather than the control gate electrode 105. In this case, since a distance over which electrons extracted from the inelastic scattering film 104b are re-accelerated becomes short at the erase operation time, an amount of energy acquired by the electrons can be suppressed. Therefore, damage done to the tunnel insulating film 102 and the interface of the tunnel insulating film/semiconductor layer is reduced. As a result, the charge holding characteristic of the memory cell can be enhanced and the write/erase operation speed can be maintained.

In FIGS. 1A and 1B, a case wherein both of the inelastic scattering film 103b and inelastic scattering film 104b are formed is explained. However, in the first embodiment, only one of the inelastic scattering film 103b and inelastic scattering film 104b may be formed.

Further, only one of the lower charge storage film 103a and upper charge storage film 103c can be formed. Likewise, only one of the lower charge block film 104a and upper charge block film 104c can be formed. Further, each of the inelastic scattering film 103b and inelastic scattering film 104b may be formed to have two or more layers.

Figure 3A:
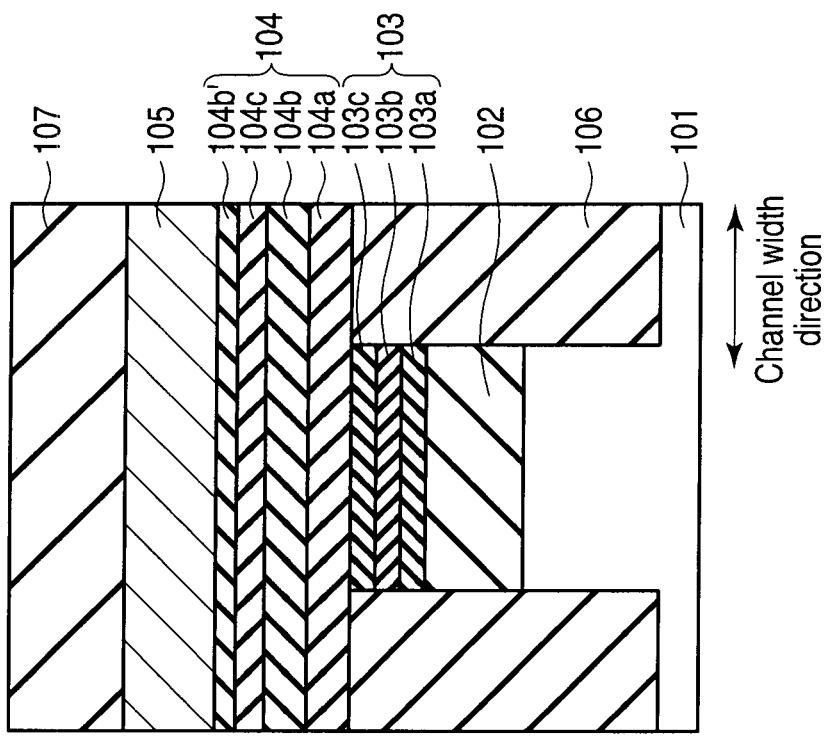
FIGS. 3A and 3B are cross-sectional views showing the structure of the MONOS memory cell according to the first embodiment.
Figure 3B:
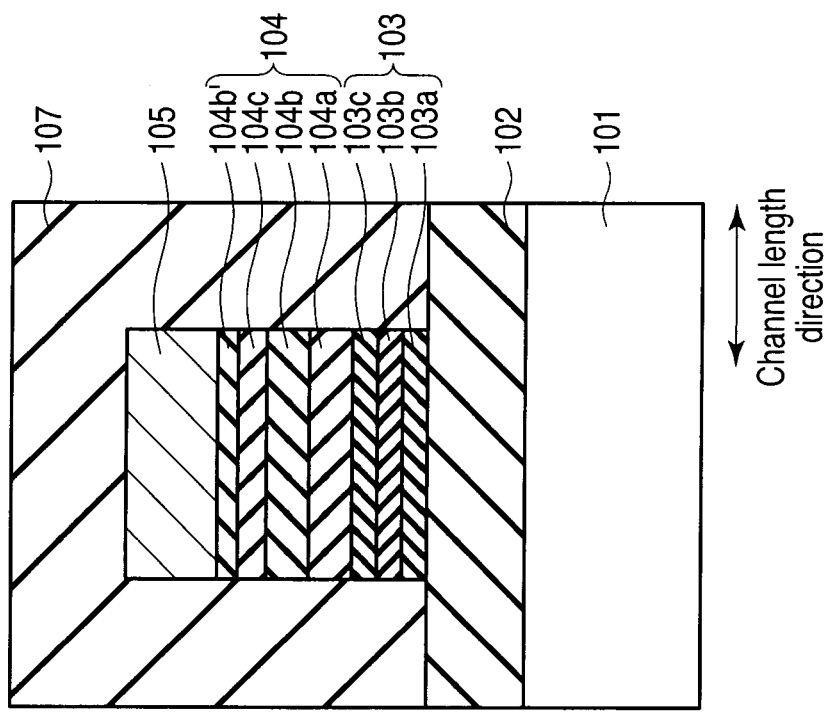

FIGS. 3A and 3B show an example in which an inelastic scattering film 104b' is additionally formed on the upper charge block film 104c. In this case, the feature that electrons are accumulated in the inelastic scattering film 104b' and an amount of electrons leaking from the control gate electrode 105 can be reduced is attained.

Further, as is explained above, energy of electrons leaking from the control gate electrode 105 is taken away by forming the inelastic scattering film 103b or inelastic scattering film 104b. Therefore, electrons can be suppressed from being impact-ionized in the semiconductor layer 101 and damage done to the tunnel insulating film 102 and the interface of the tunnel insulating film/semiconductor layer can be reduced. Therefore, degradation of the insulation of the tunnel insulating film 102 can be more effectively prevented by forming the inelastic scattering film 104b'. As a result, the charge holding characteristic of the MONOS memory cell is further enhanced.

In the first embodiment, if an inelastic scattering film of at least one layer is formed in at least one of the charge storage layer 103 and charge block layer 104, any type of laminated structure can be formed.

(1-2) First Modification

FIG. 4A is a cross-sectional view showing a MONOS memory cell according to a modification of the first embodiment in a channel length direction and the element structure itself is the same as that of FIGS. 1A and 1B.

In the modification, the height of the barrier height of an inelastic scattering film 104b is different on the semiconductor layer 101 side and on the control gate electrode 105 side. In this case, however, the height of the barrier height of the inelastic scattering film 104b is changed so as to maintain the characteristic of the charge block layer 104.

FIGS. 4B and 4C are diagrams showing the height of the barrier height of the inelastic scattering film 104b on the Y-axis and the height of the inelastic scattering film 104b in the channel-gate electrode direction on the X-axis.

As shown in FIG. 4B, the height of the barrier height is set larger on the semiconductor layer 101 side in comparison with the control gate electrode 105 side. In this case, since the height of the barrier height as viewed from the control gate electrode 105 becomes larger in comparison with the case of uniform height, an amount of electrons leaking from the control gate electrode 105 is suppressed. Therefore, damage done to the tunnel insulating film 102 and the interface of the tunnel insulating film/semiconductor layer by electrons leaking from the control gate electrode 105 is reduced. As a result, the charge holding characteristic can be enhanced and the write/erase operation speed can be maintained even if the write/erase operation is repeatedly performed. The above effects can be attained in each of the cases 1 to 3 of inclinations shown in FIG. 4B.

Further, as shown in FIG. 4C, the height of the barrier height may be set larger on the control gate electrode 105 side in comparison with the semiconductor layer 101 side. In this case, since the height of the barrier height as viewed from the charge storage layer 103 becomes larger in comparison with the case of uniform height, electrons leaking from the control gate electrode 105 are accumulated in the inelastic scattering film 104b. Therefore, damage done to the tunnel insulating film 102 and the interface of the tunnel insulating film/semiconductor layer by electrons leaking from the control gate electrode 105 is reduced. As a result, the charge holding characteristic can be enhanced and the write/erase operation speed can be maintained even if the write/erase operation is repeatedly performed. Further, when charges are held in the charge storage layer 103, extraction of charges from the charge storage layer 103 to the charge block layer 104 is suppressed and the charge holding characteristic is enhanced. The above effects can be attained in each of the cases 1 to 3 of inclinations shown in FIG. 4C.

When the inelastic scattering film 104b is formed with a multi-layered laminated structure, the heights of the barrier heights of FIGS. 4B and 4C can be combined. In this case, since a block layer having the respective characteristics is formed, damage done to the tunnel insulating film 102 and the interface of the tunnel insulating film/semiconductor layer is reduced.

Further, the trap density may be made different on the channel side and on the control gate electrode 105 side instead of changing the heights of the barrier heights shown in FIGS. 4B and 4C. For example, if the trap density is changed like the case of FIG. 4B and when electrons trapped in the inelastic scattering film 104b are de-trapped, the distance the electrons move between the tunnel insulating film 102 and the interface of the tunnel insulating film/semiconductor layer becomes short. Therefore, an amount of energy acquired by the electrons is reduced. Thus, damage cone to the tunnel insulating film 102 and the interface of the tunnel insulating film/semiconductor layer is reduced. As a result, the charge holding characteristic can be enhanced and the write/erase operation speed can be maintained even if the write and erase cycle is repeated.

Further, since electrons are trapped in a region near the electrode at the erase operation time if the trap density is changed like the case of FIG. 4C, the potential of the above region is lowered and the barrier of the charge block layer 104 as viewed from the control gate electrode 105 becomes high. Therefore, an amount of electrons injected from the control gate electrode 105 is suppressed and damage done to the tunnel insulating film 102 and the interface of the tunnel insulating film/semiconductor layer is reduced. As a result, the charge holding characteristic can be enhanced and the write/erase operation speed can be maintained even if the write and erase cycle is repeated.

When the inelastic scattering film is formed with a multi-layered structure, the trap densities in the respective layers may be made different on the channel side and on the electrode side.

In the first modification, a case wherein the inelastic scattering film 104b is used as an example is explained, but the same explanation can be similarly applied to the inelastic scattering film 103b. Further, films in which the trap density or the height of the barrier height of the inelastic scattering film 104b is changed as shown in FIG. 4B and that of the inelastic scattering film 103b is changed as shown in FIG. 4C may be combined. The above relationship can be inverted.

(1-3) Second Modification

FIG. 5A is a cross-sectional view showing a MONOS memory cell according to a modification of the first embodiment in the channel length direction and the element structure itself is the same as that of FIG. 1.

In this modification, the height of the barrier height of the inelastic scattering film 104b is made different along the channel length direction.

FIGS. 5B and 5C are diagrams showing the height of the barrier height of the inelastic scattering film 104b on the Y-axis and the channel length of the inelastic scattering film 104b in the channel length direction on the X-axis.

As shown in FIG. 5B, the height of the barrier height is made larger in the end portions of the inelastic scattering film 104b in comparison with the central portion thereof. In this case, damage done to the tunnel insulating film 102 and the interface of the tunnel insulating film/semiconductor layer is reduced in the end portions that are difficult to be controlled by an electric field and the charge holding characteristic is enhanced in the end portions of the memory cell. Therefore, since the influence by an electric field exerts on the central portion that is strongly controlled by an electric field even if damage is done to the tunnel insulating film 102 and the interface of the tunnel insulating film/semiconductor layer, the charge holding characteristic can be maintained. Further, the write/erase operation speed can be maintained even if the write and erase cycle is repeated.

Further, as shown in FIG. 5C, the height of the barrier height is made larger in the central portion of the inelastic scattering film 104b in comparison with the end portions thereof. In this case, damage done to the tunnel insulating film 102 and the interface of the tunnel insulating film/semiconductor layer is reduced in the central portion of the memory cell. Therefore, degradation of the charge holding characteristic is suppressed in the central portion of the memory cell and the write/erase speed can be maintained even if the write and erase cycle is repeated.

Further, if the charge holding characteristic in the end portion of the memory cell is degraded, an amount of charges stored in the central portion of the memory cell increases in comparison with that of the end portion. Therefore, the channel length of the memory cell can be apparently regarded as only that of the central portion in which charges are concentrated. As a result, it becomes equivalent to a case wherein the distance between the adjacent memory cells becomes larger and the feature that the effect of interference between the adjacent memory cells is suppressed can be attained.

Further, when the inelastic scattering film 104b is formed with a multi-layered laminated structure, the heights of the barrier heights of FIGS. 5B and 5C can be combined. In this case, damage done to the tunnel insulating film 102 and the interface of the tunnel insulating film/semiconductor layer is reduced on the entire surface of the memory cell. Therefore, degradation of the charge holding characteristic is suppressed and the high-speed write/erase operation can be performed even if the write and erase cycle is repeated.

Further, the trap density can be made different along the channel length direction instead of changing the height of the barrier height shown in FIGS. 5B and 5C. For example, if the trap density is changed like the case of FIG. 5B, degradation of the tunnel insulating film 102 and the interface of the tunnel insulating film/semiconductor layer is reduced in the end portion that is difficult to be controlled by an electric field and the charge holding characteristic is enhanced. Therefore, the influence by an electric field exerts on the central portion that is strongly controlled by an electric field even if damage is done to the tunnel insulating film 102 and the interface of the tunnel insulating film/semiconductor layer. As a result, degradation of the charge holding characteristic is suppressed and the write/erase speed can be maintained even if the write and erase cycle is repeated.

For example, if the trap density is changed like the case of FIG. 5B, damage done to the tunnel insulating film 102 and the interface of the tunnel insulating film/semiconductor layer is reduced in the central portion of the memory cell as in the case wherein the barrier height is similarly changed. Therefore, degradation of the charge holding characteristic in the central portion of the memory cell is suppressed and the write/erase speed can be maintained even if the write and erase cycle is repeated. Further, since this is equivalent to a case wherein the distance between the adjacent memory cells is made longer, the effect of interference between the adjacent memory cells can be suppressed.

In addition, if the inelastic scattering film is formed with a multi-layered structure, the trap densities may be made different on the channel portion and on the central portion in the respective layers.

In the second modification, a case wherein the inelastic scattering film 104*b* is used as an example is explained, but the same explanation can be similarly applied to the inelastic scattering film 103*b*.

Further, films in which the trap density or the height of the barrier height of the inelastic scattering film 104*b* is changed as shown in FIG. 5B and that of the inelastic scattering film 103*b* is changed as shown in FIG. 5C may be combined and the above relationship can be inverted.

(1-4) Third Modification

FIGS. 6A and 6B illustrate the structure of a MONOS memory cell according to a modification of the first embodiment, FIG. 6A is a cross-sectional view along the channel length direction and FIG. 6B is a cross-sectional view along the channel width direction.

First, a problem in the structure of the MONOS memory cell is explained. In the MONOS memory cell, it is necessary to form impurity regions acting as source/drain regions 108 thin to prevent occurrence of the short channel effect as the memory cell is further miniaturized. Therefore, the impurity concentration of the source/drain regions 108 becomes thin.

At the conventional erase operation time, electrons leaking from the control gate electrode 105 pass through the cell-cell insulating film 107, give damage to the cell-cell insulating film 107 near the interface of the source/drain regions 108 and cell-cell insulating film 107 and cause dangling bonds to occur. If electrons are accumulated in the dangling bonds, they repel electrons stored in the source/drain regions 108 to form a depletion layer in the source/drain regions 108. As a result, there occurs a problem that the resistance of the source/drain regions 108 increases.

Therefore, in the modification of the first embodiment, an inelastic scattering film 109 having the same structure as the inelastic scattering film 103*b* or inelastic scattering film 104*b* is formed in the cell-cell insulating film 107.

As shown in FIGS. 6A and 6B, an increase in energy of electrons leaking from the control gate electrode 105 to the source/drain regions 108 via the cell-cell insulating film 107 can be suppressed by providing an inelastic scattering film. In this case, damage given to the cell-cell insulating film 107 near the interface of the source/drain regions and cell-cell insulating film is reduced. Therefore, since a portion near the interface of the source/drain regions and cell-cell insulating film can be suppressed from being depleted, an increase in the resistance can be suppressed. As a result, the write/erase speed can be maintained even if the write and erase cycle is repeated.

In FIGS. 6A and 6B, a case wherein the inelastic scattering film 109 is formed in the cell-cell insulating film 107 between the inelastic scattering films 104*b* is explained. However, the inelastic scattering film 109 may be formed in the cell-cell insulating film 107 between the inelastic scattering films 103*b*. Further, the inelastic scattering films 109 may be formed between the inelastic scattering films 103*b* and between the inelastic scattering films 104*b*, respectively. Like the above case, in these cases, damage given to the cell-cell insulating film 107 near the interface of the source/drain regions and cell-cell insulating film is reduced.

(1-5) Manufacturing Method of First Embodiment

Next, the manufacturing method of the MONOS memory cell transistor in the first embodiment is explained with reference to FIGS. 7A and 7B to FIGS. 10A and 10B.

FIG. 7A to FIG. 10A are cross-sectional views along the channel length direction and FIG. 7B to FIG. 10B are cross-sectional views along the channel width direction.

Figure 7B:
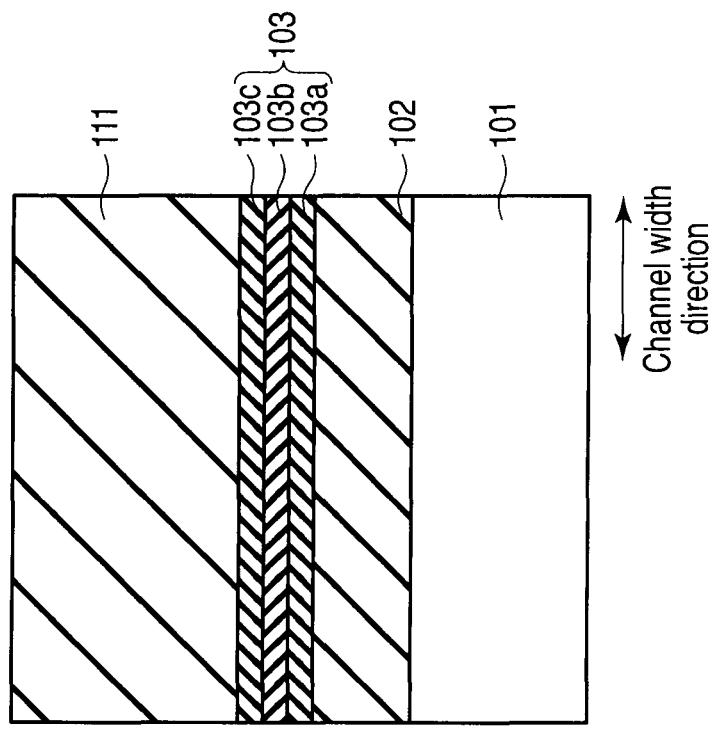
FIGS. 7A and 7B are cross-sectional views showing a manufacturing step of the MONOS memory cell according to the first embodiment.
Figure 7A:
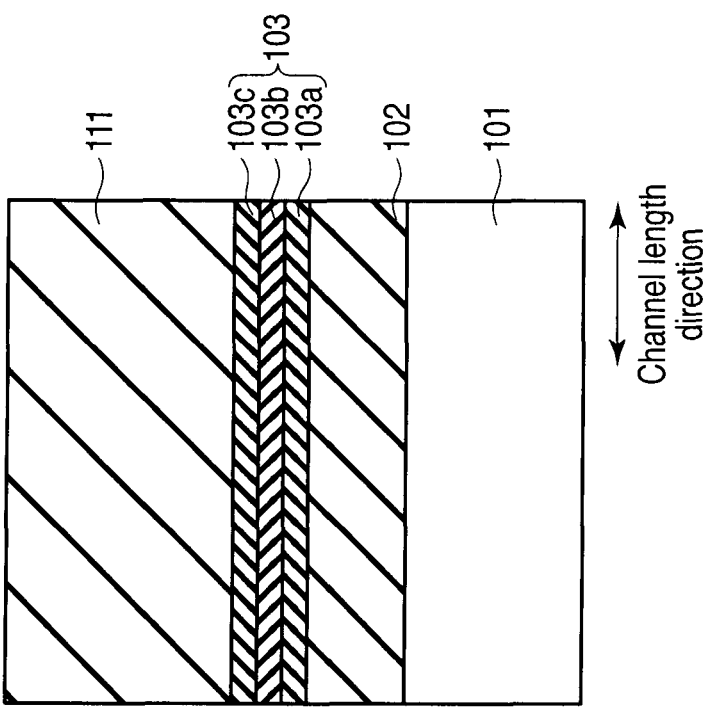

First, as shown in FIGS. 7A and 7B, for example, the surface of a semiconductor layer 101 in which impurities are doped to a desired concentration is exposed to an oxygen atmosphere of 800° C., for example, to form a tunnel insulating film 102 with a thickness of 5 nm formed of a silicon oxide film. Then, a lower charge storage film 103*a* with a thickness of 2 nm formed of a silicon nitride film is deposited by use of the chemical vapor deposition (CVD) method, for example. After this, an inelastic scattering film 103*b* with a thickness of 1 nm formed of a hafnium oxide film is deposited by use of a reactive sputtering method of argon and oxygen, for example. Next, an upper charge storage film 103*c* with a thickness of 2 nm formed of a silicon nitride film is deposited by use of the CVD method, for example, to form a charge storage layer 103. Then, a processing mask member 111 is deposited by use of the CVD method, for example.

Next, as shown in FIGS. 8A and 8B, for example, the processing mask member 111, charge storage layer 103 and tunnel insulating film 102 are sequentially etched by use of an RIE method using a resist mask to expose the semiconductor layer 101. Further, the exposed portion of the semiconductor layer 101 is etched to the depth of approximately 100 nm to form element isolation grooves 112.

Next, as shown in FIGS. 9A and 9B, for example, element isolation insulating films 112*b* formed of a silicon oxide film are formed by using a combination of a coating method and the chemical mechanical polishing (CMP) method. Then, the processing mask member 111 is removed and a lower charge block film 104*a* with a thickness of 7 nm formed of an alumina film is deposited by use of the atomic layer deposition (ALD) method, for example. Subsequently, an inelastic scattering film 104*b* with a thickness of 3 nm formed of a silicon nitride film is deposited by use of the CVD method, for example. Then, an upper charge block film 104*c* with a thickness of 4 nm formed of an alumina film is deposited by use of the ALD method, for example, to form a charge block layer 104. After this, a control gate electrode 105 and processing mask member 113 formed of a polysilicon film doped with impurities and having a thickness of 200 nm, for example, are deposited by use of the CVD method, for example.

Figure 10A:
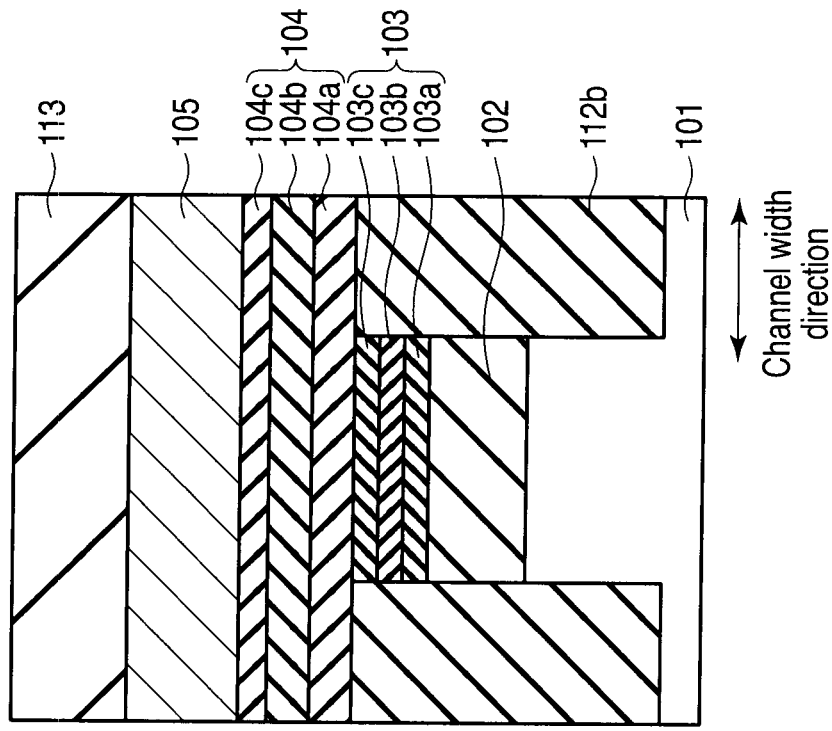
FIGS. 10A and 10B are cross-sectional views showing a manufacturing step of the MONOS memory cell according to the first embodiment.
Figure 10B:
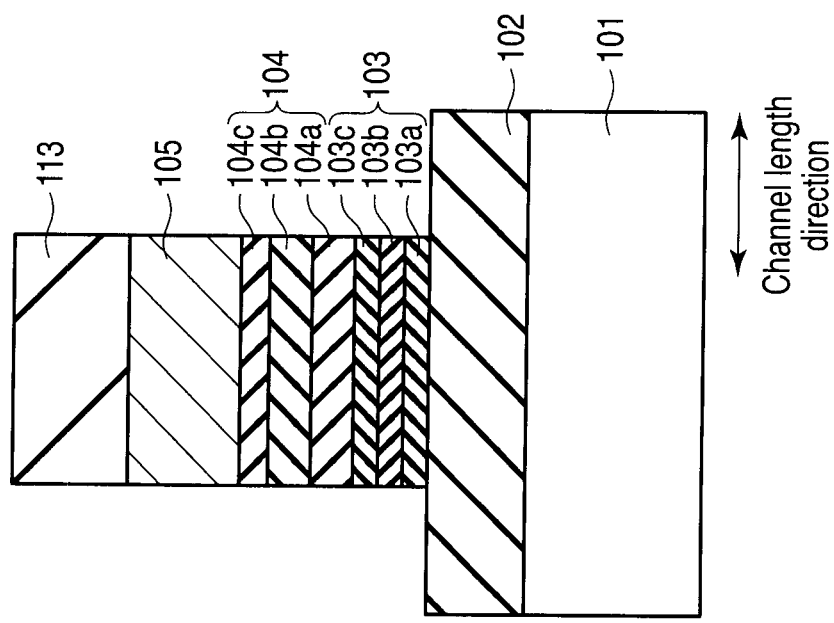

Next, as shown in FIGS. 10A and 10B, for example, the processing mask member 113, control gate electrode 105, charge block layer 104 and charge storage layer 103 are sequentially etched and processed by use of the RIE method using a resist mask, for example, to form control gate electrodes 105 that cause the distance between the adjacent memory cells to be set to 30 nm, for example, and cause the channel length thereof to be set to 30 nm, for example. At this time, the structure is formed to expose the surface of the tunnel insulating film 102. Further, source/drain regions 108 may be formed near the upper surface of the semiconductor layer 101 as required by use of an ion-implantation method, for example.

Next, the processing mask member 113 is removed and a cell-cell insulating film 107 formed of a silicon oxide film is formed by using, for example, a combination of a coating method and CMP method. Then, interconnection layers and the like are formed by use of a known technique to complete the MONOS memory cell transistor shown in FIGS. 1A and 1B.

Next, the manufacturing method in the first modification of the first embodiment is explained.

First, a case wherein the barrier height of the inelastic scattering film 104*b* varies in a direction from the channel towards the control gate electrode 105 as shown in FIG. 4A is explained.

After the lower charge block film 104*a* is formed as shown in FIGS. 9A and 9B, a silicon film of one-atom layer is formed by using Si source gas of $SiH_2Cl_2$, for example, by use of the ALD method. Next, active oxygen such as an $O_2$ radical, O radical, $O_3$ is supplied at a flow rate x to oxidize a silicon film. Then, nitrogen-series gas such as an NH radical, $NH_3$ is supplied at a flow rate y to nitride the silicon oxide film. As a result, a silicon oxynitride film is formed. At this time, it is supposed that the film formation temperature is set to 700° C. or less. Then, a silicon layer of one-atom layer is formed on the oxynitride film like the above case and the flow rates x and y are adequately changed to form an oxynitride film in which the nitrogen concentration and oxygen concentration are changed.

Thus, an oxynitride film having desired nitrogen concentration distribution and oxygen concentration distribution can be formed by depositing an oxynitride film whose concentration is changed until desired film thickness is attained. Therefore, the barrier height of the inelastic scattering film 104b can be made different in a direction from the semiconductor layer 101 towards the control gate electrode 105.

Further, an inelastic scattering film 104b is formed as shown in FIGS. 9A and 9B as another method for making the barrier height of the inelastic scattering film 104b lower in a direction from the semiconductor layer 101 towards the control gate electrode 105 as shown in FIG. 4B. Then, the barrier height shown in FIG. 4B is attained by exposing the structure to an oxygen atmosphere of 800° C., for example, and oxidizing a portion thereof on the surface side.

Next, a case wherein the trap density of the inelastic scattering film 104b varies in a direction from the semiconductor layer 101 towards the control gate electrode 105 is explained.

As shown in FIGS. 9A and 9B, a silicon oxide film is formed by use of the CVD method using disilane, oxygen and diborane after the lower charge block film 104a was formed. At this time, if the flow rates of oxygen and diborane are respectively set to x and y, the ratio of the flow rate x of oxygen to the flow rate y of diborane is changed in the initial stage of film formation and in the later stage. Therefore, the trap density of the inelastic scattering film 104b can be made different in a direction from the semiconductor layer 101 towards the control gate electrode 105.

Next, the manufacturing method in the second modification of the first embodiment is explained.

First, as shown in FIG. 5B, a case wherein the barrier height is set low in the end portions of the inelastic scattering film 104b is explained. In FIGS. 10A and 10B, nitrogen can be introduced into the end portions of the inelastic scattering film 104b by processing the structure in a nitrogen radical atmosphere after the processing mask member 113, control gate electrode 105, charge block layer 104 and charge storage layer 103 are sequentially etched by use of the RIE method using a resist mask. Therefore, the barrier height can be made low in the end portions of the inelastic scattering film 104b.

Further, as shown in FIG. 5C, in a case where the barrier height is set high in the end portions of the inelastic scattering film 104b, oxygen can be introduced into the end portions of the inelastic scattering film 104b by processing the structure in an oxygen radical atmosphere or oxygen atmosphere of 700° C. or more instead of processing the structure in the nitrogen radical atmosphere. Therefore, the barrier height can be made high in the end portions of the inelastic scattering film 104b.

Next, a case wherein the trap density is set low in the end portions of the inelastic scattering film 104b is explained. An inelastic scattering film 104b is formed by use of the CVD method using disilane and oxygen and a cell-cell insulating film 107 is formed by use of a combination of the CMP method and coating method using oxygen and diborane. Then, for example, the heat treatment is performed at 700 to 950° C. to laterally diffuse boron from the cell-cell insulating film 107 to the inelastic scattering film 104b. Therefore, the trap density can be made lower in the end portions of the inelastic scattering film 104b than in the central portion thereof by supplying a larger amount of boron to the end portions than the central portion of the inelastic scattering film 104b.

Next, a case wherein the trap density is set high in the end portions of the inelastic scattering film 104b is explained. An inelastic scattering film 104b is formed by use of the CVD method using disilane, oxygen and diborane and a cell-cell insulating film 107 is formed by use of a combination of the CMP method and coating method using disilane and oxygen. Then, for example, the heat treatment is performed at 700 to 950° C. to laterally diffuse boron from the inelastic scattering film 104b to the cell-cell insulating film 107. Therefore, the trap density can be made higher in the end portions of the inelastic scattering film 104b than in the central portion thereof since boron in the end portions of the inelastic scattering film 104b is diffused into the cell-cell insulating film.

Next, the manufacturing method in the third modification of the first embodiment is explained.

In FIGS. 9A and 9B, an inelastic scattering film 104b formed of a silicon nitride film is formed by use of the CVD method using disilane, oxygen and diborane. Then, like the manufacturing method of the first embodiment, an upper charge block film 104c, control gate electrode 105 and the like are formed. Next, in FIGS. 6A and 6B, a cell-cell insulating film 107 formed of a silicon oxide film is formed by use of a combination of the CMP method and coating method using disilane and oxygen. After the cell-cell insulating film 107 is formed, for example, the heat treatment is performed at 700 to 950° C. to diffuse boron from the inelastic scattering film 104b to the cell-cell insulating film 107. As a result, an inelastic scattering film 109 is formed in the cell-cell insulating film.

(2-1) Structure of Second Embodiment

Figure 11A:
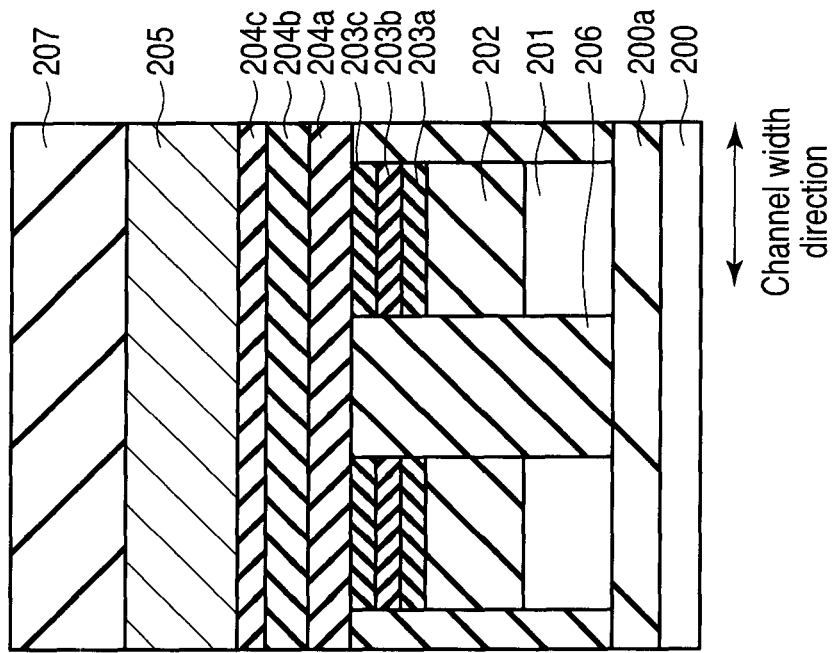
FIGS. 11A and 11B are cross-sectional views showing the structure of a depletion MONOS memory cell according to a second embodiment.
Figure 11B:
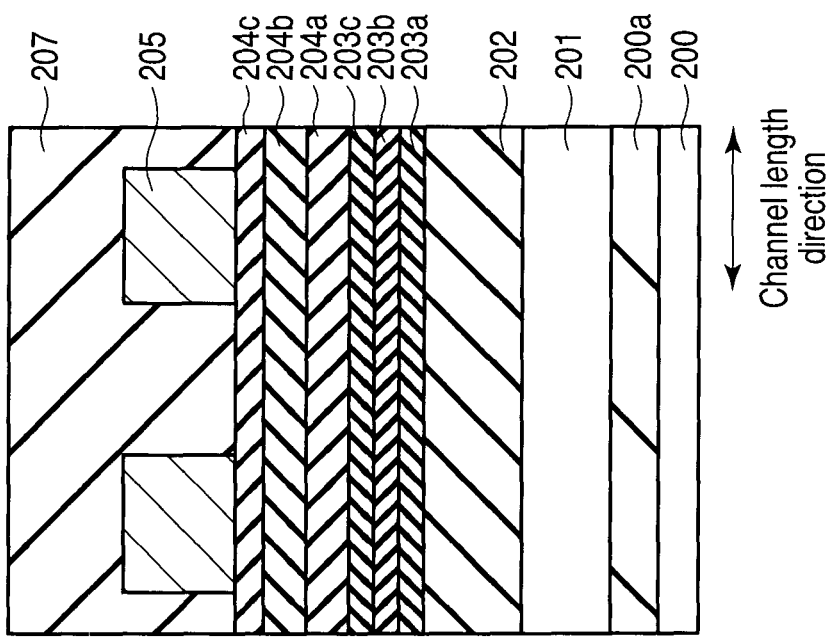

FIGS. 11A and 11B illustrate the structure of a depletion MONOS memory cell to which the silicon-on-insulator (SOI) technique is applied, FIG. 11A is a cross-sectional view in the channel length direction and FIG. 11B is a cross-sectional view in the channel width direction.

In the depletion MONOS memory cell of the second embodiment, it is supposed that the distance between adjacent memory cells is set to 100 nm or less and the channel width of the memory cell is also set to 100 nm or less.

An insulating layer 200a is formed on the upper surface of a silicon substrate 200 and semiconductor layers 201 are formed on the upper surface of the insulating layer 200a. Further, tunnel insulating films 202 (first insulating layer), charge storage layers 203, charge block layer 204 (second insulating layer) and control gate electrodes 205 are sequentially formed in this order on the surface of the semiconductor layer 201. In this case, the charge storage layer 203 includes a lower charge storage film 203a, inelastic scattering film 203b and upper charge storage film 203c formed sequentially from the bottom and the charge block layer 204 includes a lower charge block film 204a, inelastic scattering film 204b and upper charge block film 204c formed sequentially from the bottom. Further, the control gate electrodes 205 in the channel length direction are covered with a cell-cell insulating film 207 and separated as memory cells.

As shown in FIG. 11B, element isolation insulating films 206 are filled in space areas between the sidewalls of the tunnel insulating films 202 and charge storage layers 203 to isolate the memory cells in the channel width direction.

In this case, the inelastic scattering film is similarly defined as in the first embodiment and the detailed explanation thereof is omitted.

In the second embodiment, the inelastic scattering film 203b is formed in the charge storage layer 203 and the inelastic scattering film 204b is formed in the charge block layer 204. Since the above inelastic scattering films take energy of electrons leaking from the control gate electrodes 205 in the erase operation, electrons are not impact-ionized in the semiconductor layers 201. Therefore, damage done to the tunnel insulating film 202 and the interface of the tunnel insulating film/semiconductor layer is reduced and thus the insulation of the tunnel insulating film 202 can be maintained. As a result, the charge holding characteristic of the depletion MONOS memory cell can be prevented from being degraded.

Like the first embodiment, in the second embodiment, since damage done to the tunnel insulating film 202 and the interface of the tunnel insulating film/semiconductor layer is reduced, the write/erase speed can be maintained even if the write/erase operation is repeatedly performed.

Further, since the constituent materials, the condition of film thickness and the formation condition of the respective films of the depletion MONOS memory cell are the same as the constituent materials, the condition of film thickness and the formation condition of the respective films in the first embodiment, the detailed explanation thereof is omitted. For example, the insulating layer 200a is formed of a silicon oxide film containing silicon and oxygen as main components.

(2-2) First Modification

FIG. 12A is a cross-sectional view showing a depletion MONOS memory cell according to a modification of the second embodiment in the channel length direction and the element structure itself is the same as that of FIGS. 11A and 11B.

FIG. 12B is a diagram showing the trap density of the inelastic scattering film 204b on the Y-axis and the channel length of the inelastic scattering film 204b in the channel length direction on the X-axis.

In the depletion MONOS memory cell, an electric field applied to the channel region between the memory cells is weaker than an electric field applied to the channel region under the memory cell. Therefore, if electrons leaking from the control gate electrode 205 break down the tunnel insulating film 202 formed between the memory cells and the tunnel insulating film 202 formed near the interface of the tunnel insulating film/semiconductor layer at the erase operation time, the resistance of the semiconductor layer 201 between the memory cells increases. As a result, there occurs a problem that the device does not function as a depletion memory cell.

Therefore, in the modification of the second embodiment, the trap density of the inelastic scattering film is varied in the channel length direction. Specifically, the trap density of the inelastic scattering film 204b formed between the memory cells is made higher than the trap density of the inelastic scattering film 204b formed in the lower portion of the memory cell.

In this case, when electrons leaking from the control gate electrode 205 pass through the inelastic scattering film 204b between the memory cells at the erase operation time, the electrons tend to be trapped in the inelastic scattering film 204b. Therefore, the tunnel insulating film 202 and the tunnel insulating film 202 formed near the interface of the tunnel insulating film/semiconductor layer can be prevented from being broken down and an increase in the resistance of the semiconductor layer 201 can be suppressed. As a result, the write/erase speed can be maintained.

(2-2) Manufacturing Method

Next, the manufacturing method of the depletion MONOS memory cell in the second embodiment is explained with reference to FIGS. 13A and 13B to FIGS. 17A and 17B. FIG. 13A to FIG. 17A are cross-sectional views showing the depletion MONOS memory cell in the channel length direction and FIG. 13B to FIG. 17B are cross-sectional views showing the depletion MONOS memory cell in the channel width direction.

Figure 13A:
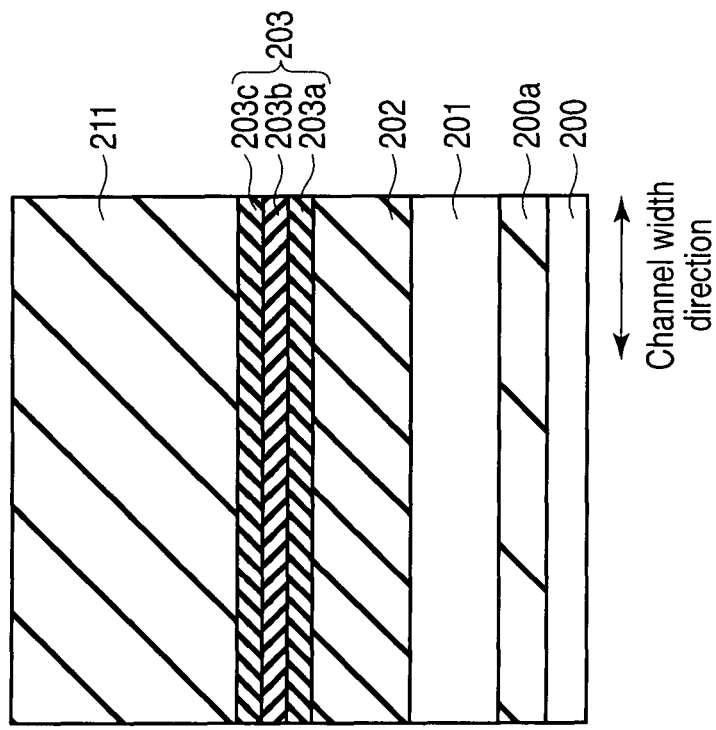
FIGS. 13A and 13B are cross-sectional views showing a manufacturing step of the depletion MONOS memory cell according to the second embodiment.
Figure 13B:
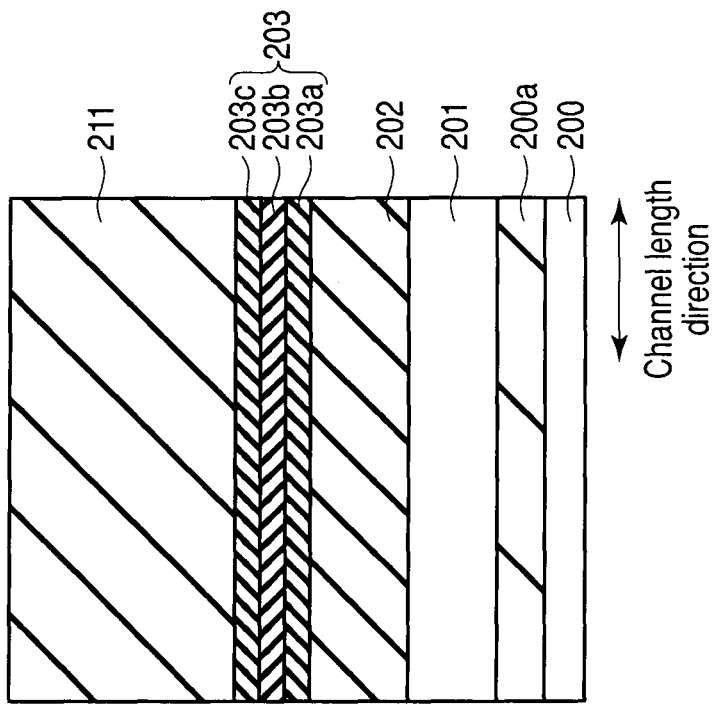

First, as shown in FIGS. 13A and 13B, the surface of a semiconductor layer 201 on an SOI substrate having desired impurities doped therein is exposed to an oxygen atmosphere of 800° C., for example, to form a tunnel insulating film 202 with a thickness of 5 nm formed of a silicon oxide film. Further, a lower charge storage film 203a with a thickness of 2 nm formed of a silicon nitride film is deposited by the CVD method, for example. Then, an inelastic scattering film 203b with a thickness of 1 nm formed of a hafnium oxide film is deposited by use of a reactive sputtering method of argon and oxygen, for example. Next, an upper charge storage film 203c with a thickness of 2 nm formed of a silicon nitride film is deposited by use of the CVD method, for example, to form a charge storage layer 203. Then, a processing mask member 211 is deposited by use of the CVD method, for example.

Figure 14A:
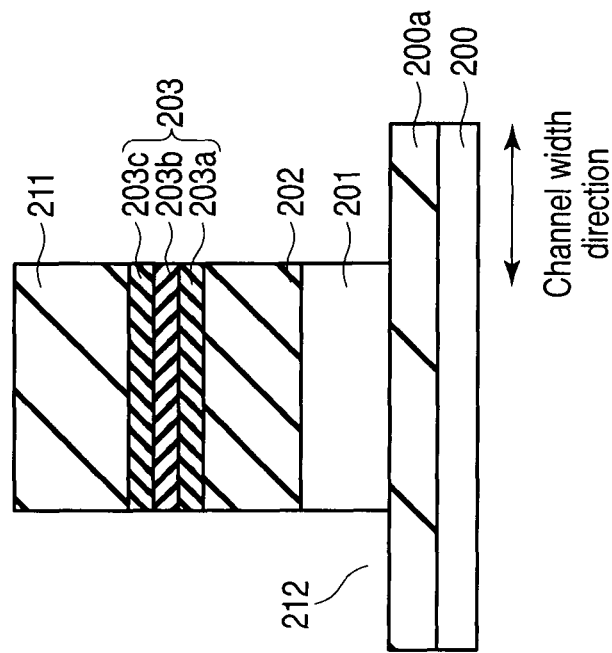
FIGS. 14A and 14B are cross-sectional views showing a manufacturing step of the depletion MONOS memory cell according to the second embodiment.
Figure 14B:
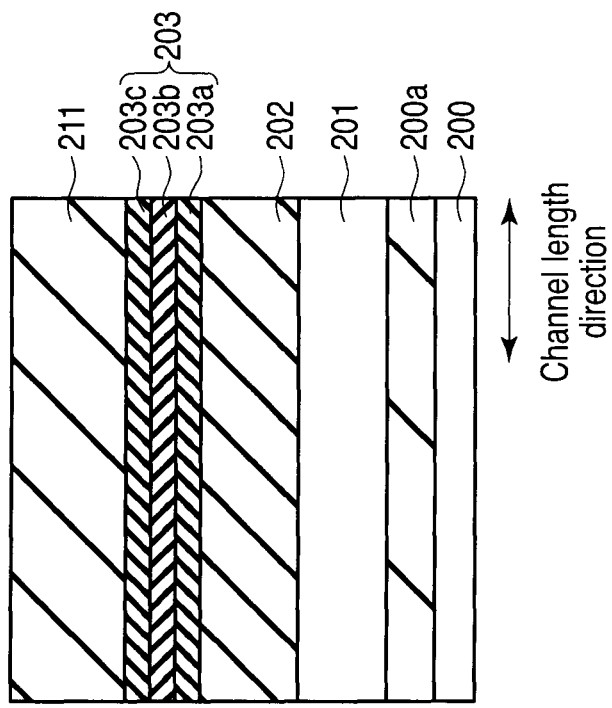

Next, as shown in FIGS. 14A and 14B, the processing mask member 211, charge storage layer 203 and tunnel insulating film 202 are sequentially etched by use of, for example, the RIE method using a resist mask to expose the semiconductor layer 201. Further, the exposed portion of the semiconductor layer 201 is etched to the depth of approximately 100 nm to form element isolation grooves 212.

Figure 15B:
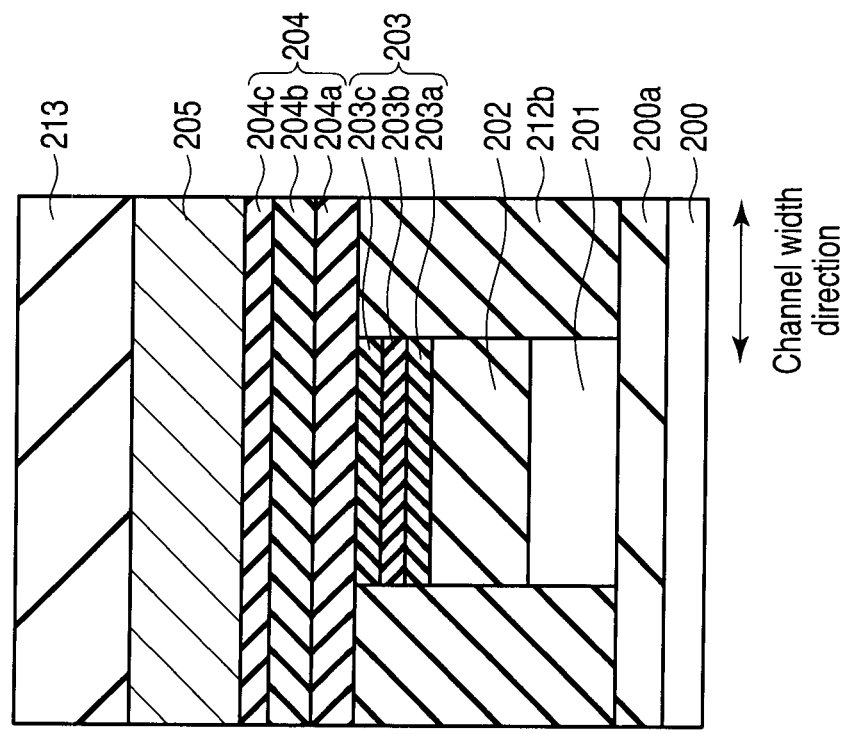
FIGS. 15A and 15B are cross-sectional views showing a manufacturing step of the depletion MONOS memory cell according to the second embodiment.
Figure 15A:
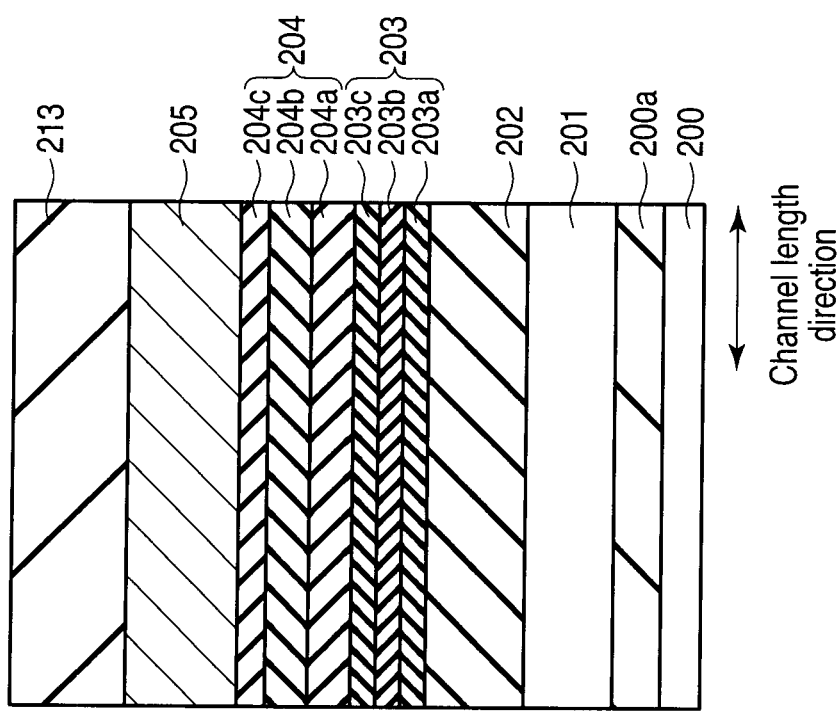

Next, as shown in FIGS. 15A and 15B, element isolation insulating films 212b formed of a silicon oxide film are formed by using, for example, a combination of a coating method and the chemical mechanical polishing (CMP) method. Then, the processing mask member 211 is removed and a lower charge block film 204a with a thickness of 7 nm formed of an alumina film is deposited by use of the atomic layer deposition (ALD) method, for example. Subsequently, an inelastic scattering film 204b with a thickness of 3 nm formed of a silicon nitride film is deposited by use of the CVD method, for example. Then, an upper charge block film 204c with a thickness of 4 nm formed of an alumina film is deposited by use of the ALD method, for example, to form a charge block layer 204. After this, a control gate electrode 205 and processing mask member 213 formed of a polysilicon film doped with impurities and having a thickness of 200 nm, for example, are deposited by use of the CVD method, for example.

Figure 16B:
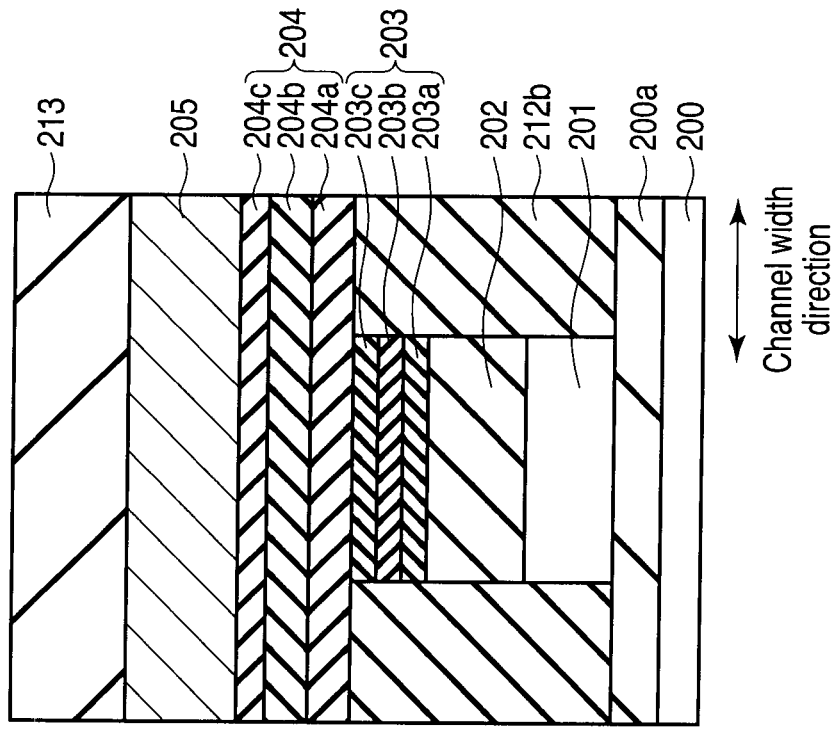
FIGS. 16A and 16B are cross-sectional views showing a manufacturing step of the depletion MONOS memory cell according to the second embodiment.
Figure 16A:
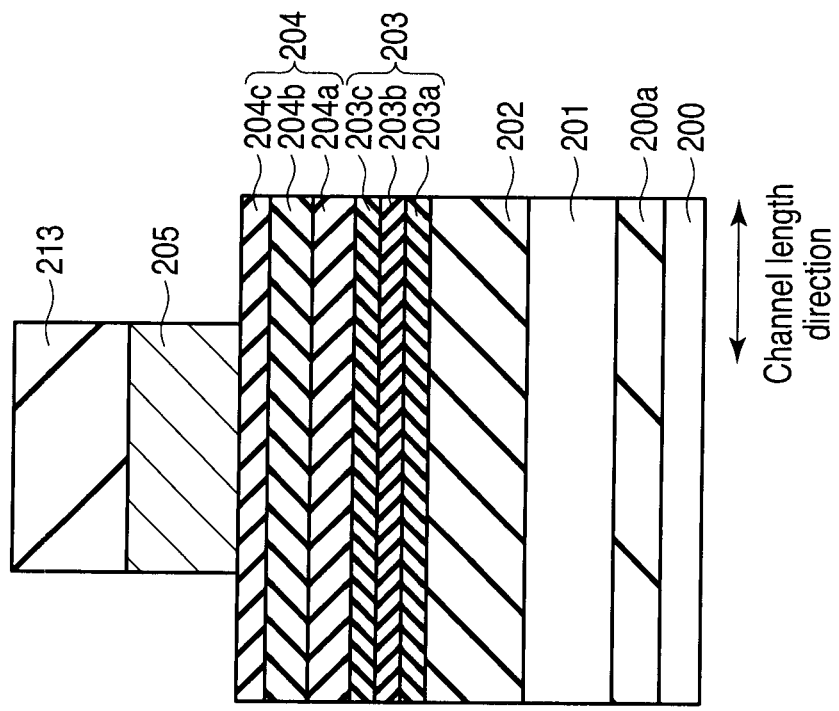

Next, as shown in FIGS. 16A and 16B, the processing mask member 213 and control gate electrode 105 are sequentially etched by use of, for example, the RIE method using a resist mask to form control gate electrodes 205 that cause the distance between the adjacent memory cells to be set to 30 nm, for example, and cause the channel length thereof to be set to 30 nm, for example.

Figure 17B:
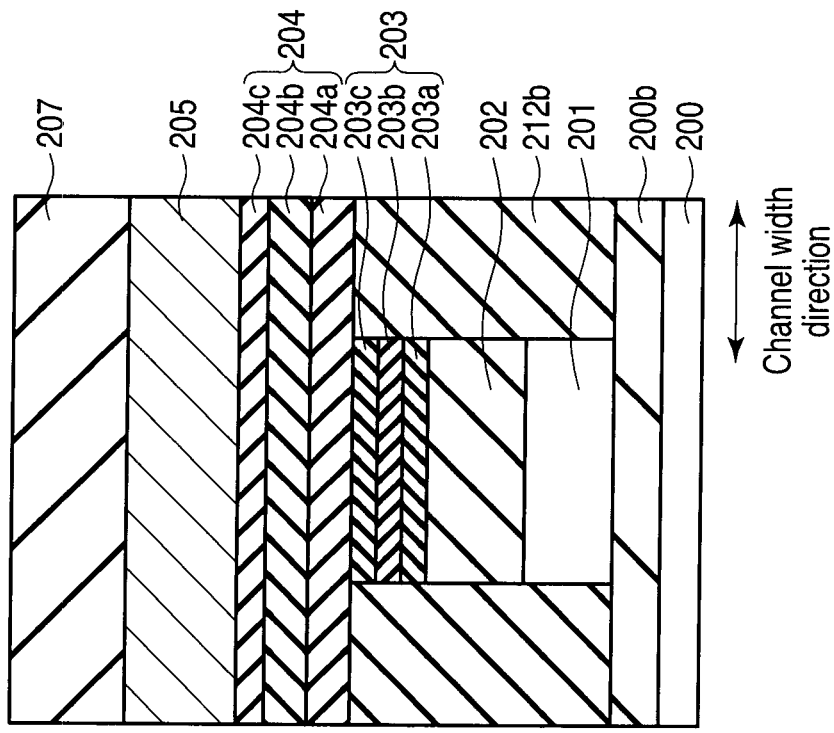
FIGS. 17A and 17B are cross-sectional views showing a manufacturing step of the depletion MONOS memory cell according to the second embodiment.
Figure 17A:
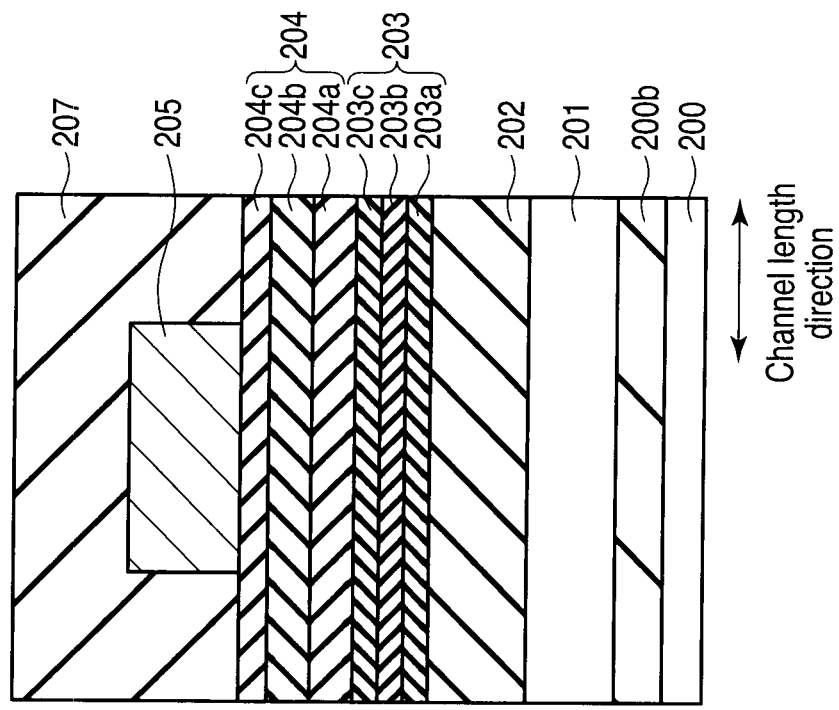

Next, as shown in FIGS. 17A and 17B, after the processing mask member 213 is removed, a cell-cell insulating film 207 formed of a silicon oxide film is formed by using, for example, a combination of a coating method and CMP method. Then, interconnection layers and the like are formed by use of a known technique to complete the depletion MONOS memory cell transistor according to the second embodiment.

Next, the manufacturing method in a modification of the second embodiment is explained.

First, as shown in FIGS. 17A and 17B, a cell-cell insulating film 207 is formed by use of the CVD method using disilane, oxygen and diborane after the control crate electrode 205 was formed and the processing mask member was removed. Then, the heat treatment is performed at 700 to 950° C. to diffuse boron from the cell-cell insulating film 207 towards the charge block layer 204 that faces the cell-cell insulating film 207. As a result, since the trap density of the inelastic scattering film 204b formed below the cell-cell insulating film can be increased, the inelastic scattering film 204b formed between the memory cells can be formed to have desired trap density as shown in FIG. 12B. Further, the inelastic scattering film 204b may be formed of a material other than the silicon nitride film or a material equivalent to that of the lower charge block film 204a and upper charge block film 204c.

(3-1) Structure of Third Embodiment

Next, a third embodiment is explained with reference to the accompanying drawings by taking a memory (hereinafter referred to as a bit-cost scalable [BiCS] memory) to which the BiCS technique is applied as an example.

Figure 18A:
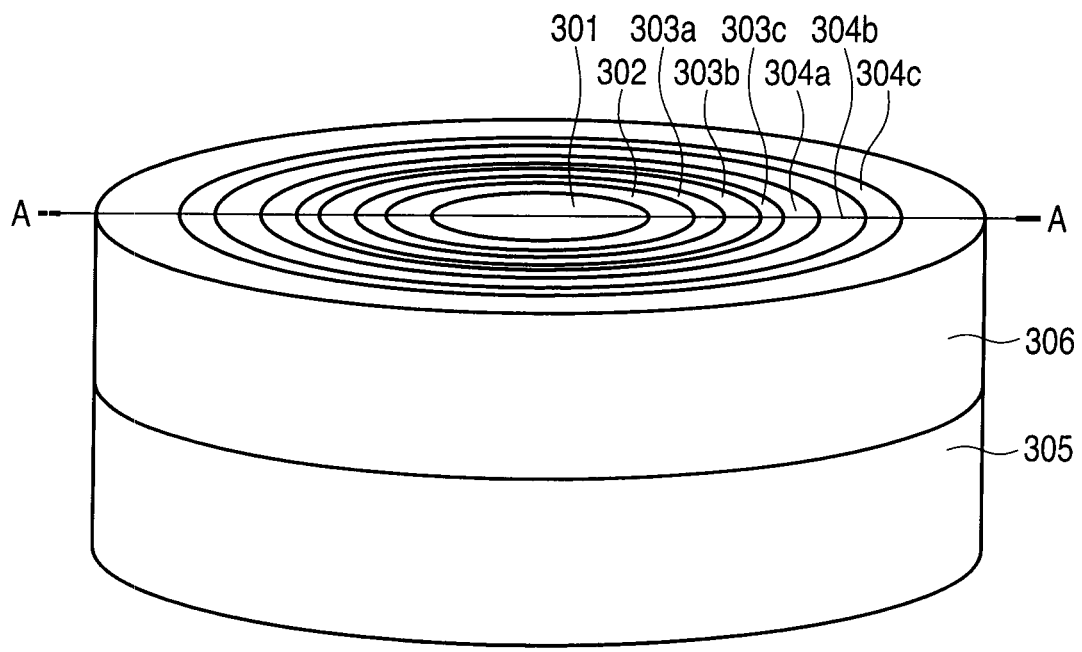
FIGS. 18A and 18B are a bird's-eye view and cross-sectional view showing the structure of a BiCS memory according to a third embodiment.
Figure 18B:
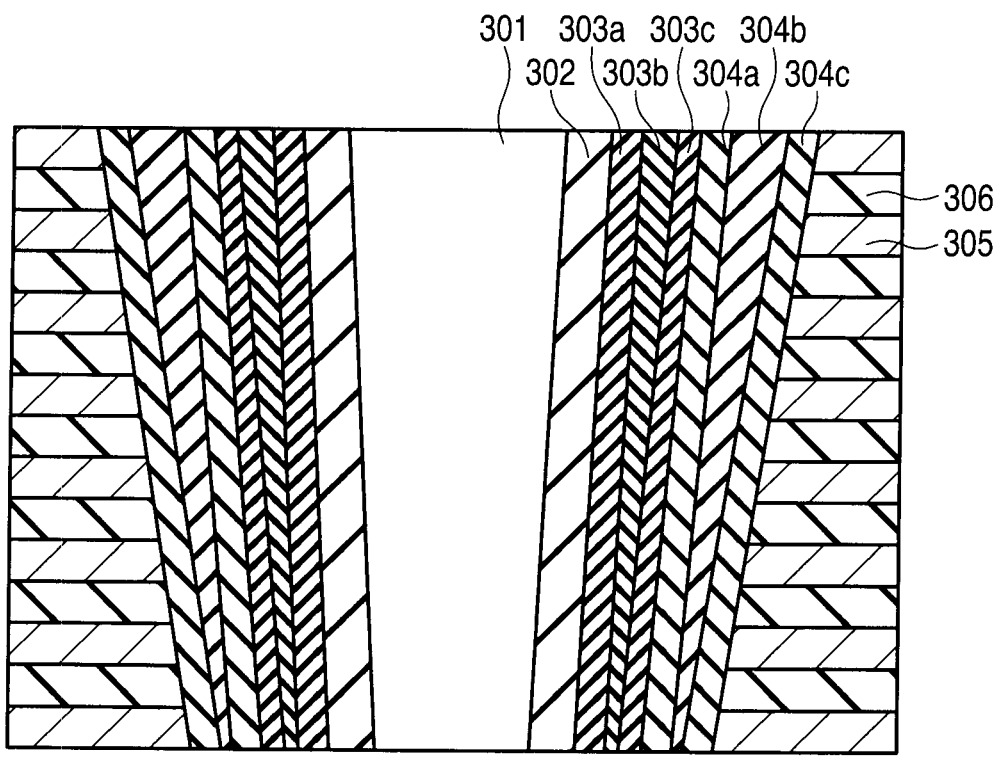

FIGS. 18A and 18B illustrate the structure of one memory cell of a BiCS memory according to a third embodiment, FIG. 18A is a bird's-eye view and FIG. 18B is a cross-sectional view taken along line A-A of FIG. 18A. In this case, it is supposed that the distance between the adjacent memory cells is set to approximately 50 nm, for example.

A tunnel insulating film (third insulating layer) 302, charge storage layer 303 formed of an insulating film and charge block layer (second insulating layer) 304 are sequentially formed on the peripheral portion of a column-shaped semiconductor layer 301 vertically formed on a semiconductor layer. In this case, the charge storage layer 303 has an inner charge storage film 303a, inelastic scattering film 303b and outer charge storage film 303c formed sequentially from a portion near the semiconductor layer 301. The charge block layer 304 has an inner charge block film 304a, inelastic scattering film 304b and outer charge block film 304c formed sequentially from a portion near the semiconductor layer 301. Further, control gate electrodes 305 laminated in a direction perpendicular to the substrate surface and isolated by cell-cell insulating films (first insulating layers) 306 are formed on the outer peripheral portion of the charge block layer 304.

In the bird's-eye view of FIG. 18A, only one layer of the control gate electrode 305 and cell-cell insulating film 306 is shown, but in practice, the control gate electrodes 305 and cell-cell insulating films 306 have a multi-layered laminated structure as shown in FIG. 18B and may be formed of a desired number of layers. Thus, memory cells arranged side by side to cover the semiconductor layer 301 configure a NAND string.

In this case, the inelastic scattering film is similarly defined as in the first embodiment and the detailed explanation thereof is omitted.

In the third embodiment, the inelastic scattering film 303b is formed in the charge storage layer 303 and the inelastic scattering film 304b is formed in the charge block layer 304. Since the above inelastic scattering films take energy of electrons leaking from the control gate electrodes 305 in the erase operation, electrons are not impact-ionized in the semiconductor layers 301. Therefore, damage done to the tunnel insulating film 302 and the interface of the tunnel insulating film/semiconductor layer is reduced and thus the insulation of the tunnel insulating film 302 can be maintained. As a result, the charge holding characteristic of the BiCS memory cell can be prevented from being degraded.

Like the first and second embodiments, in the third embodiment, since damage done to the tunnel insulating film 302 and the interface of the tunnel insulating film/semiconductor layer is reduced, the write/erase speed can be maintained even if the write/erase operation is repeatedly performed.

Further, since the constituent materials of the respective films of the memory cell, the condition of film thickness of the respective films other than the inelastic scattering films and the formation condition are the same as the constituent materials, the condition of film thickness and the formation condition of the films in the first embodiment, the detailed explanation thereof is omitted.

In the BiCS memory, as shown in FIG. 18B, the radius of the semiconductor layer 301 is made small in the lower portion (on the semiconductor substrate side) of the semiconductor layer 301 and is made large in the upper portion (on the bit line side) of the semiconductor layer 301. Therefore, since an electric field applied to the charge block layer 304 formed on the lower portion of the semiconductor layer 301 becomes weak, the number of electrons leaking from the control gate electrode 305 becomes smaller and an amount of energy acquired by the leak electrons until they reach the interface of the tunnel insulating film/semiconductor layer becomes small. Therefore, damage done to the tunnel insulating film 302 and the interface of the tunnel insulating film/semiconductor layer is less. Further, since an electric field applied to the charge block layer 304 formed on the upper portion of the semiconductor layer 301 becomes strong, the number of electrons leaking from the control gate electrode 305 becomes larger and an amount of energy acquired by the leak electrons until they reach the interface of the tunnel insulating film/semiconductor layer becomes large. Therefore, damage done to the tunnel insulating film 302 and the interface of the tunnel insulating film/semiconductor layer is greater. As a result, since damage done to the tunnel insulating film 302 and the interface of the tunnel insulating film/semiconductor layer formed on the upper and lower portions of the semiconductor layer 301 varies, there occurs a problem that the charge holding characteristic will vary when the write/erase operation is repeatedly performed.

In the third embodiment, the inelastic scattering film 303b and inelastic scattering film 304b are formed thin on the lower portion of the semiconductor layer 301 and formed thick on the upper portion thereof. At this time, it is supposed that the difference in the film thickness on the upper and lower portions of the inelastic scattering film 304b is set to approximately 1 to 7 nm, for example. As a result, the intensity of an electric field applied to the charge block layer 304 formed on the upper portion of the semiconductor layer 301 is reduced and a variation in the intensity of an electric field applied to the charge block layer 304 formed on the upper and lower portions of the semiconductor layer 301 becomes less. This is because the difference between the radius of the control gate electrode 305 and the radius of the semiconductor layer 301 becomes smaller in the upper and lower portions of the semiconductor layer 301. Further, as is explained in the first embodiment, more energy can be taken away from electrons as the film thickness of the inelastic scattering film becomes larger or the trap density becomes higher. Therefore, damage done to the tunnel insulating film 302 and the interface of the tunnel insulating film/semiconductor layer can be reduced by forming the inelastic scattering film thick on the upper portion of the semiconductor layer 301.

Therefore, in the third embodiment, the intensity of an electric field applied to the charge block layer 304 formed on the upper potion of the semiconductor layer 301 can be made weak, the number of electrons leaking from the control gate electrode 305 can be reduced and damage done to the tunnel insulating film 302 and the interface of the tunnel insulating film/semiconductor layer can be reduced. As a result, the charge holding characteristic of the BiCS memory can be prevented from being degraded. Therefore, the feature that the charge holding characteristic can be maintained even if the write/erase operation is repeatedly performed is attained.

(3-2) Manufacturing Method of Third Embodiment

Next, the manufacturing method of the BiCS memory according to the third embodiment is explained with reference to FIGS. 19A and 19B to FIGS. 22A and 22B. FIG. 19A to FIG. 22A are cross-sectional views taken along line A-A of FIG. 18A, and FIG. 19B to FIG. 22B are plan views of the BiCS memory.

Figure 19B:
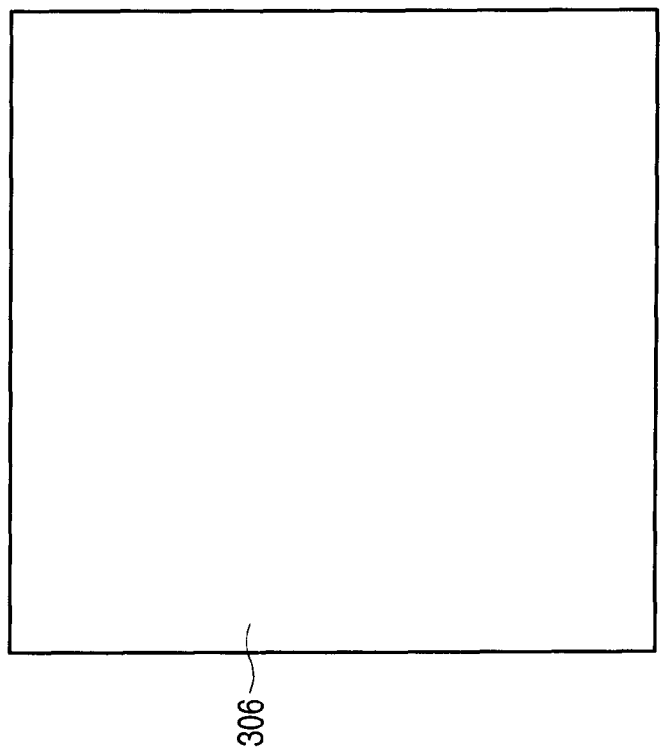
FIGS. 19A and 19B are cross-sectional views showing a manufacturing step of the BiCS memory according to the third embodiment.
Figure 19A:
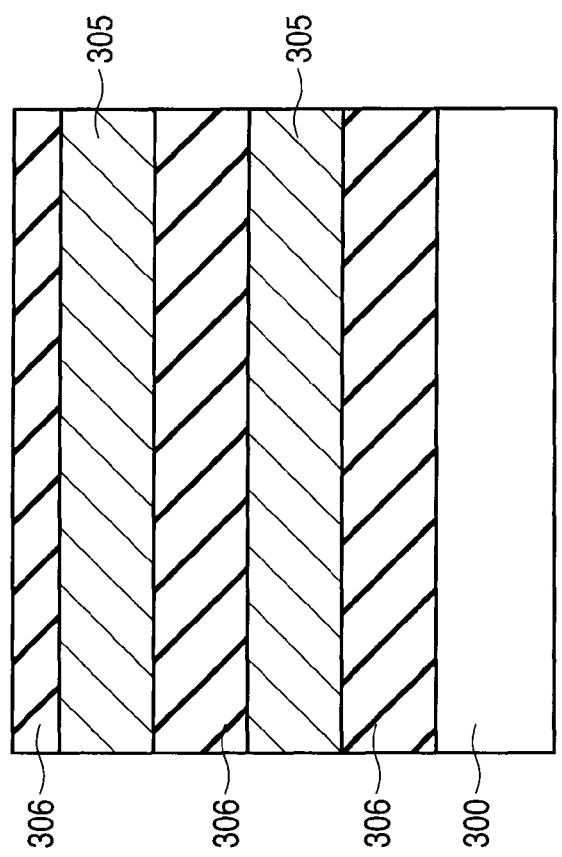

First, as shown in FIGS. 19A and 19B, cell-cell insulating films (first insulating films) 306 each formed of a silicon oxide film with a thickness of 50 nm and control gate electrodes 305 each formed of a silicon film doped with impurities with a thickness of 50 nm are alternately deposited to form a multi-layered laminated structure by use of the CVD method, for example, on the surface of a semiconductor layer 300. In FIGS. 19A and 19B, a case wherein the laminated structure is a two-layered structure is shown, but the structure may be formed of a desired number of layers. Further, it is supposed that source diffusion layers and source line-side select gate lines are formed in the semiconductor layer 300.

Figure 20B:
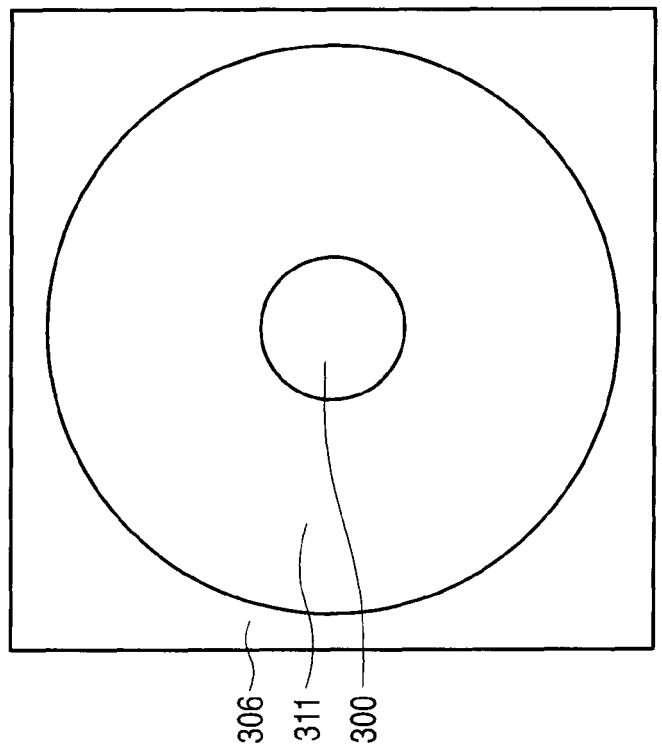
FIGS. 20A and 20B are cross-sectional views showing a manufacturing step of the BiCS memory according to the third embodiment.
Figure 20A:
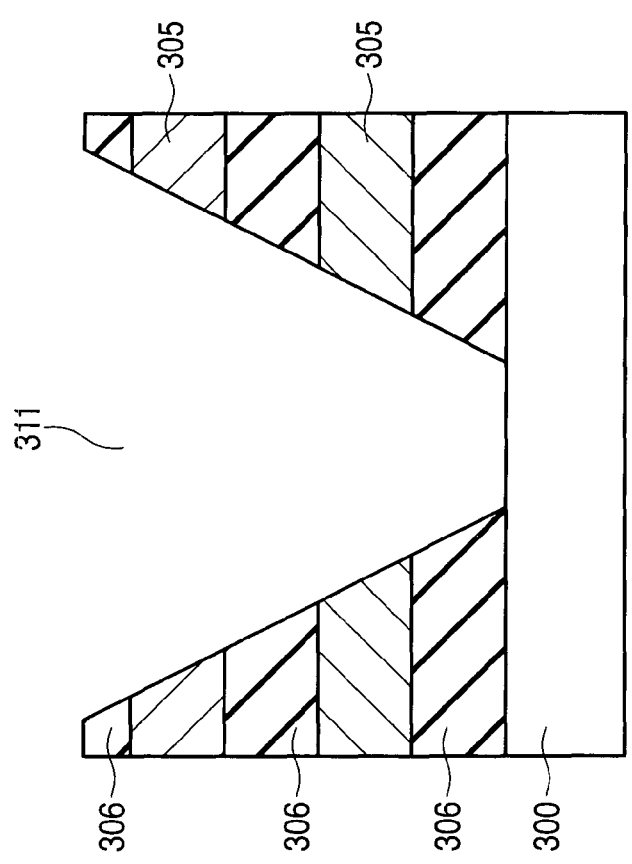

Next, as shown in FIGS. 20A and 20B, the cell-cell insulating films 306 and control gate electrodes 305 are selectively etched by use of the RIE method using a resist mask (not shown) until the surface of the semiconductor layer 300 is exposed. Thus, a column-shaped groove 311 with a diameter of approximately 70 nm, for example, is formed in the multi-layered laminated structure. When the cell-cell insulating films 306 and control gate electrodes 305 are selectively etched and removed, the column-shaped groove is formed in a forward-tapered shape with the groove diameter set small on the semiconductor layer side and the groove diameter set large on the surface side thereof.

Figures 21A, 21B:
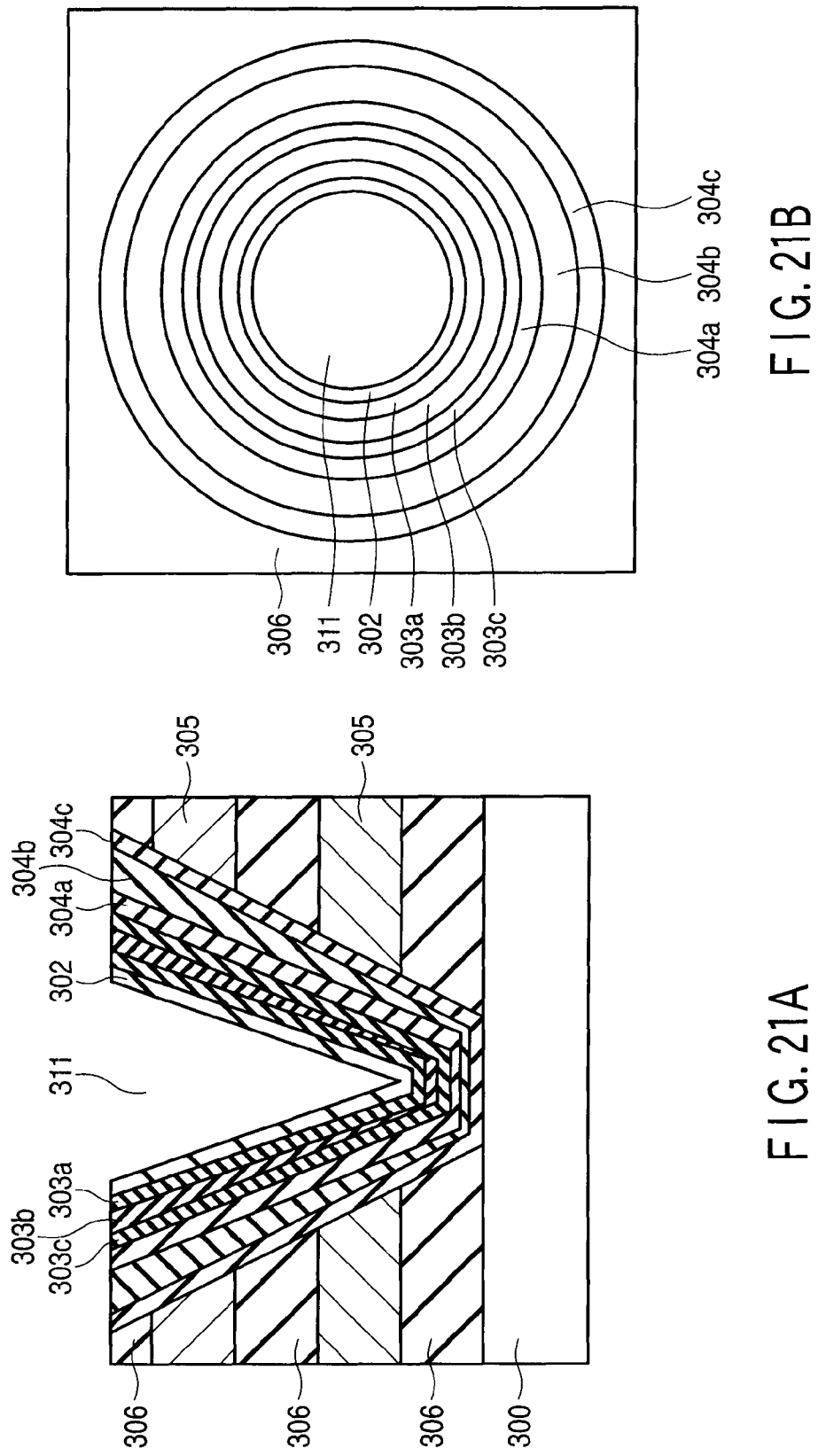
FIGS. 21A and 21B are cross-sectional views showing a manufacturing step of the BiCS memory according to the third embodiment.

Next, as shown in FIGS. 21A and 21B, an outer charge block film 304c formed of a silicon oxide film with a thickness of 3 nm is deposited on the inner wall of the column-shaped groove 311 by use of the ALD method, for example. Then, an inelastic scattering film 304b formed of a silicon nitride film with a thickness of 3 nm is formed by use of the CVD method. Subsequently, an inner charge block film 304a formed of a silicon oxide film with a thickness of 7 nm is deposited by use of the ALD method to form a charge block layer (second insulating layer) 304. After this, an outer charge storage film 303c formed of a silicon nitride film with a thickness of 2 nm is deposited by use of the ALD method, for example. Then, an inelastic scattering film 303b formed of a hafnium oxide film with a thickness of 1 nm is deposited by use of the reactive sputtering method using argon and oxygen. Subsequently, an inner charge storage film 303a formed of a silicon nitride film with a thickness of 2 nm is deposited by use of the ALD method to form a charge storage layer 303. After this, a tunnel insulating film (third insulating layer) 302 formed of a silicon oxide film with a thickness of 5 nm is formed by use of the ALD method, for example.

Figure 22B:
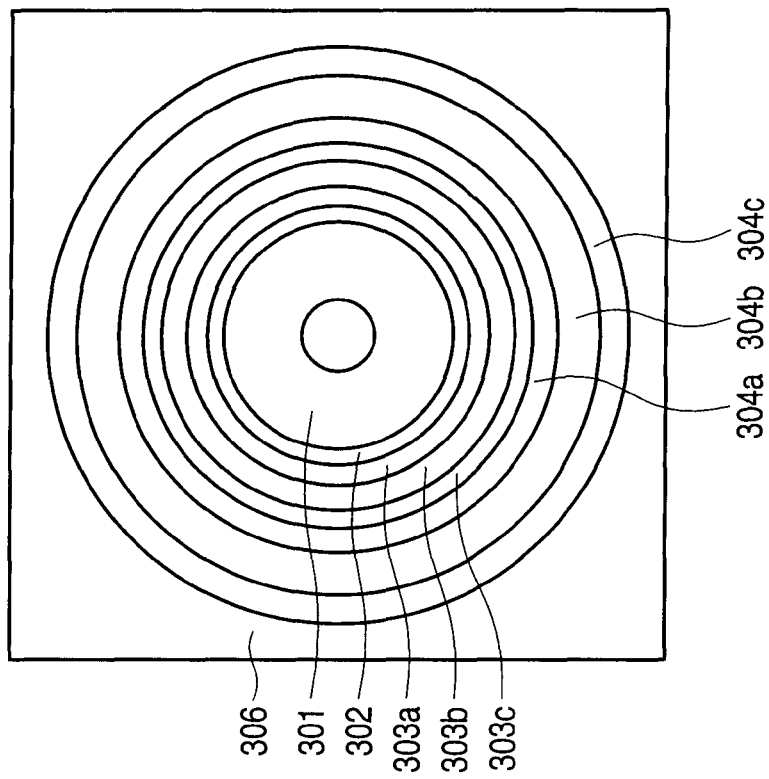
FIGS. 22A and 22B are cross-sectional views showing a manufacturing step of the BiCS memory according to the third embodiment.
Figure 22A:
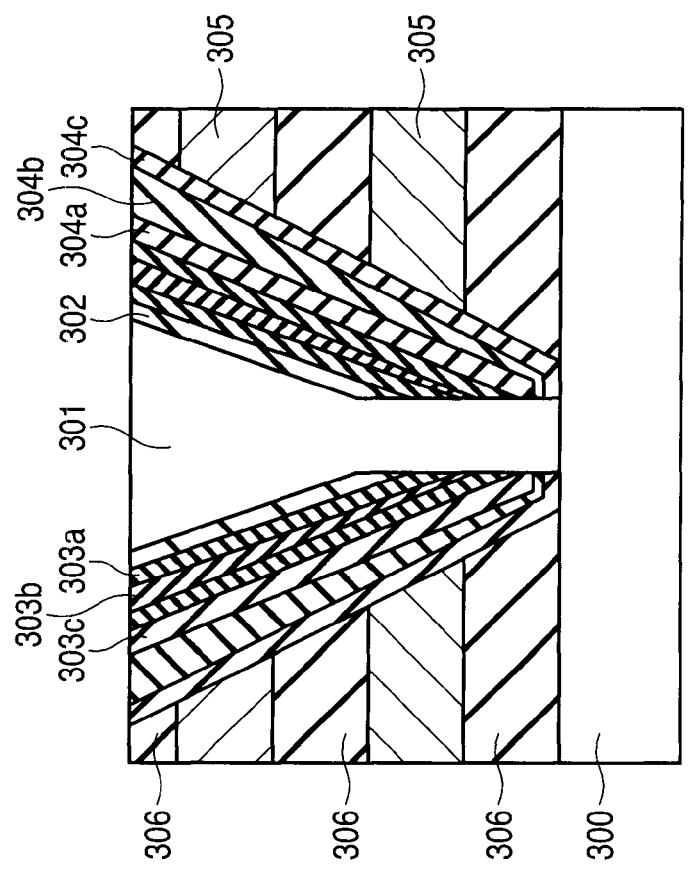

Next, as shown in FIGS. 22A and 22B, portions of the tunnel insulating film 302, charge storage layer 303 and charge block layer 304 formed on the bottom surface portion of the column-shaped groove 311 are selectively etched by use of the RIE method using a resist mask to expose the surface of the semiconductor layer 300. Then, after a semiconductor layer 301 having impurities doped therein and used as a channel region is deposited by use of the CVD method, for example, the heat treatment is performed in a nitrogen atmosphere of 600° C. After this, interconnection layers and the like are formed by use of a known technique to complete a BiCS memory.

When the inelastic scattering film 304b is formed thicker in a higher portion of the semiconductor layer 301, the following method may be used. For example, a nitride film can be formed thicker in a portion closer to the surface side of the column-shaped groove 311 and formed thinner in a portion of the column-shaped groove 311 closer to the semiconductor layer 300 by simultaneously supplying dichlorosilane ($SiCl_2H_2$) and $NH_3$ gas and forming the film at the film formation temperature of approximately 650 to 800° C. in a pressure condition of approximately 0.3 to 10 Torr by use of the CVD method, for example. Further, the film can be similarly formed by use of the PECVD method. In this case, the difference in the film thickness in the upper portion and lower portion of the inelastic scattering film 304b is approximately 1 to 7 nm.

(4) Modification of Present Invention

The present invention is not limited to the above embodiments and can be embodied by modifying the constituents without departing from the scope. Further, various inventions can be made by adequately combining a plurality of constituents disclosed in the above embodiments. For example, some constituents may be removed from all of the constituents disclosed in the above embodiments or constituents disclosed in the different embodiments may be adequately combined. In addition, the memory structure of this invention may be applied to both of the NAND memory cells and NOR memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor layer with a main surface,
   a laminated structure portion having a plurality of control gate electrodes and a plurality of first insulating films alternately laminated on the main surface of the semiconductor layer, wherein a groove that exposes the main surface of the semiconductor layer at a bottom of the groove is formed to penetrate a portion of the laminated structure portion,
   a second insulating layer formed to line an inner wall of the groove,
   a charge storage layer formed on the second insulating layer,
   a third insulating layer formed on the charge storage layer and to leave a space in the groove, and
   a semiconductor region formed on the third insulating layer to fill the space in the groove and to reach the bottom of the groove,
   wherein at least one inelastic scattering film that reduces energy of electrons by scattering is contained in at least one of the charge storage layer and the second insulating layer.

wherein the second insulating layer has a laminated structure of an insulating film and the inelastic scattering film, and the inelastic scattering film is one of a hafnium oxide film containing hafnium and oxygen and a silicon film containing at least one of nitrogen and oxygen.

2. The device according to claim 1, wherein trap density of the inelastic scattering film is not less than $10^{18}/cm^3$.

3. The device according to claim 1, wherein a potential barrier of the inelastic scattering film is different between a central portion and an end portion in a channel length direction defined by the control gate electrode.

4. The device according to claim 1, wherein trap density of the inelastic scattering film on the control gate electrode side is different from that of the semiconductor layer side.

5. The device according to claim 1, wherein a diameter of the grove becomes larger as a distance from the bottom of the groove becomes larger, and a thickness of the inelastic scattering film becomes larger as the distance from the bottom of the groove becomes larger.

6. A nonvolatile semiconductor memory device comprising:

a semiconductor layer with a main surface, a laminated structure portion having a plurality of control gate electrodes and a plurality of first insulating films alternately laminated on the main surface of the semiconductor layer, wherein a groove that exposes the main surface of the semiconductor layer at a bottom of the groove is formed to penetrate a portion of the laminated structure portion, a second insulating layer formed to line an inner wall of the groove, a charge storage layer formed on the second insulating layer, a third insulating layer formed on the charge storage layer and to leave a space in the groove, and a semiconductor region formed on the third insulating layer to fill the space in the groove and to reach the bottom of the groove, wherein at least one inelastic scattering film that reduces energy of electrons by scattering is contained in at least one of the charge storage layer and the second insulating layer, wherein the charge storage layer has a laminated structure of a charge storage film and the inelastic scattering film, and the inelastic scattering film is formed of a hafnium oxide film containing hafnium and oxygen.

7. A nonvolatile semiconductor memory device comprising:

a semiconductor layer with a main surface, a laminated structure portion having a plurality of control gate electrodes and a plurality of first insulating films alternately laminated on the main surface of the semiconductor layer, wherein a groove that exposes the main surface of the semiconductor layer at a bottom of the groove is formed to penetrate a portion of the laminated structure portion, a second insulating layer formed to line an inner wall of the groove, a charge storage layer formed on the second insulating layer, a third insulating layer formed on the charge storage layer and to leave a space in the groove, and a semiconductor region formed on the third insulating layer to fill the space in the groove and to reach the bottom of the groove, wherein at least one inelastic scattering film that reduces energy of electrons by scattering is contained in at least one of the charge storage layer and the second insulating layer, wherein a potential barrier of the inelastic scattering film on the control gate electrode side is different from that of the semiconductor layer side.

* * * * *